US012675926B2

(12) United States Patent
Takahashi et al.

(10) Patent No.: US 12,675,926 B2
(45) Date of Patent: Jul. 7, 2026

(54) ROTARY ELECTRIC MACHINE MANAGING SYSTEM

(71) Applicant: TOSHIBA ENERGY SYSTEMS & SOLUTIONS CORPORATION, Kawasaki (JP)

(72) Inventors: Tomoaki Takahashi, Yokohama Kanagawa (JP); Takashi Harakawa, Yokohama Kanagawa (JP); Makoto Takanezawa, Yokohama Kanagawa (JP); Akira Fujimoto, Kawasaki Kanagawa (JP); Hiroyuki Yoda, Yokohama Kanagawa (JP); Koji Ando, Yokohama Kanagawa (JP)

(73) Assignee: TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 167 days.

(21) Appl. No.: 18/413,435

(22) Filed: Jan. 16, 2024

(65) Prior Publication Data

US 2024/0404136 A1 Dec. 5, 2024

(30) Foreign Application Priority Data

May 29, 2023 (JP) ................................ 2023-087516

(51) Int. Cl.
| | |
|---|---|
| *G06T 11/26* | (2026.01) |
| *G01R 31/12* | (2020.01) |
| *G08B 21/18* | (2006.01) |

(52) U.S. Cl.
CPC .......... *G06T 11/26* (2026.01); *G01R 31/1272* (2013.01); *G06T 2200/24* (2013.01); *G08B 21/18* (2013.01)

(58) Field of Classification Search
CPC .............. G06T 11/206; G06T 2200/24; G01R 31/1272; G01R 31/343; G01R 31/346; G08B 21/18
See application file for complete search history.

(56) References Cited

U.S. PATENT DOCUMENTS

| | | | | |
|---|---|---|---|---|
| 2007/0139056 A1* | 6/2007 | Kaneiwa | ............ | G01R 31/1227 324/536 |
| 2021/0405117 A1 | 12/2021 | Otani et al. | | |

(Continued)

FOREIGN PATENT DOCUMENTS

| | | |
|---|---|---|
| EP | 1 703 293 A1 | 9/2006 |
| JP | 2000-125498 A | 4/2000 |

(Continued)

OTHER PUBLICATIONS

Nakahara et al., "Worldwide Service and Predictive Maintenance Supporting Drive Systems," Fuji Times, Fuji Electric Holdings Co., Ltd., 2009, vol. 82, No. 2, (pp. 140-147) (Year: 2009).*

(Continued)

*Primary Examiner* — Daniel F Hajnik
*Assistant Examiner* — Thomas John Foster
(74) *Attorney, Agent, or Firm* — Foley & Lardner LLP

(57) ABSTRACT

A rotary electric machine managing system of an embodiment has an image data generating unit configured in such a way as to generate image data which indicates past breakdown voltage-related information related to a breakdown voltage of the past, present breakdown voltage-related information related to a breakdown voltage of the present, and future breakdown voltage-related information related to a breakdown voltage of the future as breakdown voltage-related information. The past breakdown voltage-related information is information found based on a partial discharge signal obtained from a rotary electric machine at a time of operation in the rotary electric machine of the past.

(Continued)

The present breakdown voltage-related information is information found based on a partial discharge signal obtained from the rotary electric machine at a time of operation in the rotary electric machine of the present.

12 Claims, 12 Drawing Sheets

(56) References Cited

U.S. PATENT DOCUMENTS

| | | | |
|---|---|---|---|
| 2022/0024049 A1 | 1/2022 | Kudo et al. | |
| 2022/0221501 A1 | 7/2022 | Harakawa et al. | |

FOREIGN PATENT DOCUMENTS

| | | | |
|---|---|---|---|
| JP | 2002-071742 A | 3/2002 | |
| JP | 2006-252465 A | 9/2006 | |
| JP | 2013-024669 A | 2/2013 | |
| JP | 2013-117164 A | 6/2013 | |
| JP | 2017-084346 A | 5/2017 | |
| JP | 6147099 B2 | 6/2017 | |
| JP | 2017-220980 A | 12/2017 | |
| JP | 2022-023582 A | 2/2022 | |
| JP | 2022-107116 A | 7/2022 | |
| JP | 7157517 B2 | 10/2022 | |
| RO | 125933 A2 * | 12/2010 | |
| RU | 2705858 C1 | 11/2019 | |
| WO | WO-2022/091376 A1 | 5/2022 | |

OTHER PUBLICATIONS

Kande, M.; Isaksson, A.J.; Thottappillil, R.; Taylor, N. Rotating Electrical Machine Condition Monitoring Automation—A Review. Machines 2017, 5, 24. https://doi.org/10.3390/machines5040024 (Year: 2017).*

Singh, V., Gangsar, P., Porwal, R. et al. Artificial intelligence application in fault diagnostics of rotating industrial machines: a state-of-the-art review. J Intell Manuf 34, 931-960 (2023). https://doi.org/10.1007/s10845-021-01861-5 (Year: 2023).*

K. Li et al., "Electrical Performance Degradation Model and Residual Electrical Life Prediction for AC Contactor," in IEEE Transactions on Components, Packaging and Manufacturing Technology, vol. 10, No. 3, pp. 400-417, Mar. 2020, doi: 10.1109/TCPMT.2020.2966516. (Year: 2020).*

AU Office Action issued in the corresponding Australian Patent Application No. 2024200241 dated Oct. 31, 2024 (5 pages).

JP Office Action for Japanese Patent Application No. 2023-087516 dated Aug. 12, 2025 (12 pages).

Koji Haga, Global Vacuum Pressure Impregnated Insulation Technique for 22kV Class, Thermal and Nuclear Power Generation, Jun. 2008 (pp. 56-60).

Nakahara et al., "Worldwide Service and Predictive Maintenance Supporting Drive Systems," Fuji Times, Fuji Electric Holdings Co., Ltd., 2009, vol. 82, No. 2, (pp. 140-147).

JP Office Action for JP Appl. Ser. No. 2023-087516 dated Jan. 20, 2026 (8 pages).

Nishiyama, et al., "Predictive maintenance technology for after-sales service of electrical equipment," Fuji Electric Holdings Co., Ltd., 2005, vol. 78, No. 6 (pp. 451-455).

* cited by examiner

START

CALCULATION OF MAXIMUM PARTIAL DISCHARGE MAGNITUDE — ST10

CALCULATION OF BREAKDOWN ELECTRIC FIELD — ST20

GENERATION OF BREAKDOWN VOLTAGE-RELATED INFORMATION — ST30

GENERATION OF IMAGE DATA — ST40

DISPLAY OF IMAGE DATA — ST50

END

FIG.8B

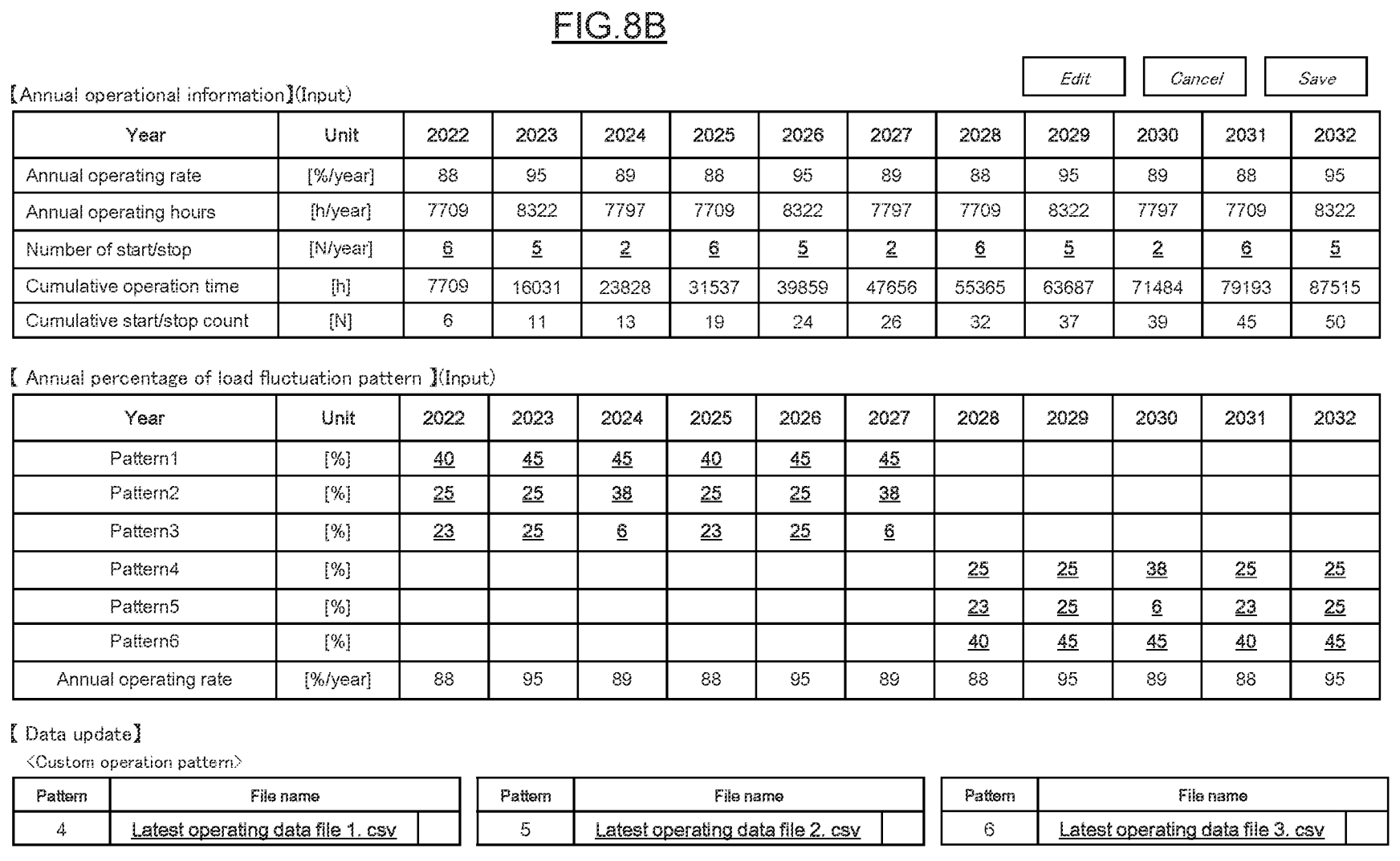

Edit    Cancel    Save

【Annual operational information】(Input)

| Year | Unit | 2022 | 2023 | 2024 | 2025 | 2026 | 2027 | 2028 | 2029 | 2030 | 2031 | 2032 |
|---|---|---|---|---|---|---|---|---|---|---|---|---|
| Annual operating rate | [%/year] | 88 | 95 | 89 | 88 | 95 | 89 | 88 | 95 | 89 | 88 | 95 |
| Annual operating hours | [h/year] | 7709 | 8322 | 7797 | 7709 | 8322 | 7797 | 7709 | 8322 | 7797 | 7709 | 8322 |
| Number of start/stop | [N/year] | 6 | 5 | 2 | 6 | 5 | 2 | 6 | 5 | 2 | 6 | 5 |
| Cumulative operation time | [h] | 7709 | 16031 | 23828 | 31537 | 39859 | 47656 | 55365 | 63687 | 71484 | 79193 | 87515 |
| Cumulative start/stop count | [N] | 6 | 11 | 13 | 19 | 24 | 26 | 32 | 37 | 39 | 45 | 50 |

【Annual percentage of load fluctuation pattern】(Input)

| Year | Unit | 2022 | 2023 | 2024 | 2025 | 2026 | 2027 | 2028 | 2029 | 2030 | 2031 | 2032 |
|---|---|---|---|---|---|---|---|---|---|---|---|---|
| Pattern1 | [%] | 40 | 45 | 45 | 40 | 45 | 45 | | | | | |
| Pattern2 | [%] | 25 | 25 | 38 | 25 | 25 | 38 | | | | | |
| Pattern3 | [%] | 23 | 25 | 6 | 23 | 25 | 6 | | | | | |
| Pattern4 | [%] | | | | | | | 25 | 25 | 38 | 25 | 25 |
| Pattern5 | [%] | | | | | | | 23 | 25 | 6 | 23 | 23 |
| Pattern6 | [%] | | | | | | | 40 | 45 | 45 | 40 | 45 |
| Annual operating rate | [%/year] | 88 | 95 | 89 | 88 | 95 | 89 | 88 | 95 | 89 | 88 | 95 |

【Data update】
〈Custom operation pattern〉

| Pattern | File name |
|---|---|
| 4 | Latest operating data file 1. csv |

| Pattern | File name |
|---|---|
| 5 | Latest operating data file 2. csv |

| Pattern | File name |
|---|---|
| 6 | Latest operating data file 3. csv |

ROTARY ELECTRIC MACHINE MANAGING SYSTEM

CROSS-REFERENCE TO RELATED APPLICATIONS

This application is based upon and claims the benefit of priority from Japanese Patent Application No. 2023-087516, filed on May 29, 2023; the entire contents of which are incorporated herein by reference.

FIELD

Embodiments relate to a rotary electric machine managing system.

BACKGROUND

A rotary electric machine used as a generator or the like has a stator and a rotor and is configured in such a way that the rotor rotates at a time of operation. In the rotary electric machine, as for the stator, a stator coil is housed in a stator slot formed in a stator core via an insulating member, for example, whereby deterioration of the insulating member or the like progresses by the operation of the rotary electric machine.

More specifically, electric deterioration, heat deterioration, and machine deterioration occur in the insulating member of the stator. The electric deterioration is caused by an electric stress due to a high voltage, and the heat deterioration is caused by a Joule loss. The mechanical deterioration is caused by an electromagnetic vibration and a thermal cycle by a load variation. The insulating member comes to have a lower insulation performance with progress of the electric deterioration, the heat deterioration, and the mechanical deterioration, resulting in a higher possibility of breakdown.

In recent years, power generation using renewable energy is promoted in order to reduce a carbon dioxide emission amount. In power generation using renewable energy, a power generation amount changes drastically depending on weather or the like. Therefore, in order to supplement unstable power supply by power generation using renewable energy, a power generating facility of thermal power generation or the like often carries out an adjusted operation in which a load is adjusted, instead of an operation based mainly on a rated load. Consequently, in the rotary electric machine, deterioration of the insulating member which constitutes the stator is likely to progress.

Thus, there is proposed a technique and so on to find a breakdown voltage of the insulating member which constitutes the stator of the rotary electric machine by a destructive test or a nondestructive test to thereby implement insulation diagnosis.

However, it has been conventionally difficult to accurately grasp aging of information related to a breakdown voltage of an insulating member which constitutes a stator of a rotary electric machine.

Accordingly, a problem to be solved by the present invention is to provide a rotary electric machine managing system which can easily and accurately grasp the aging of information related to the breakdown voltage of the insulating member which constitutes the stator of the rotary electric machine.

BRIEF DESCRIPTION OF THE DRAWINGS

FIG. 8B is a view schematically illustrating an example of an input manipulation image which is used when an input of operation plan information D701 (ST110) is implemented in the rotary electric machine managing system 700 according to the second embodiment.

DETAILED DESCRIPTION

An embodiment is a rotary electric machine managing system which manages breakdown voltage-related information related to a breakdown voltage of an insulating member, for a rotary electric machine that has a rotor and a stator in which a stator coil is housed in a stator slot formed in a stator core via the insulating member. The rotary electric machine managing system has an image data generating unit configured in such a way as to generate image data which indicates past breakdown voltage-related information related to the breakdown voltage of the past, present breakdown voltage-related information related to the breakdown voltage of the present, and future breakdown voltage-related information related to the breakdown voltage of the future as the breakdown voltage-related information. The past breakdown voltage-related information is information found based on a partial discharge signal obtained from the rotary electric machine at a time of operation in the rotary electric machine of the past. The present breakdown voltage-related information is information found based on a partial discharge signal obtained from the rotary electric machine at a time of operation in the rotary electric machine of the present.

First Embodiment

[A] Rotary Electric Machine 10

Before an explanation of a rotary electric machine managing system of this embodiment, a rotary electric machine 10 being a managed object of the rotary electric machine managing system will be described.

Figure 1:
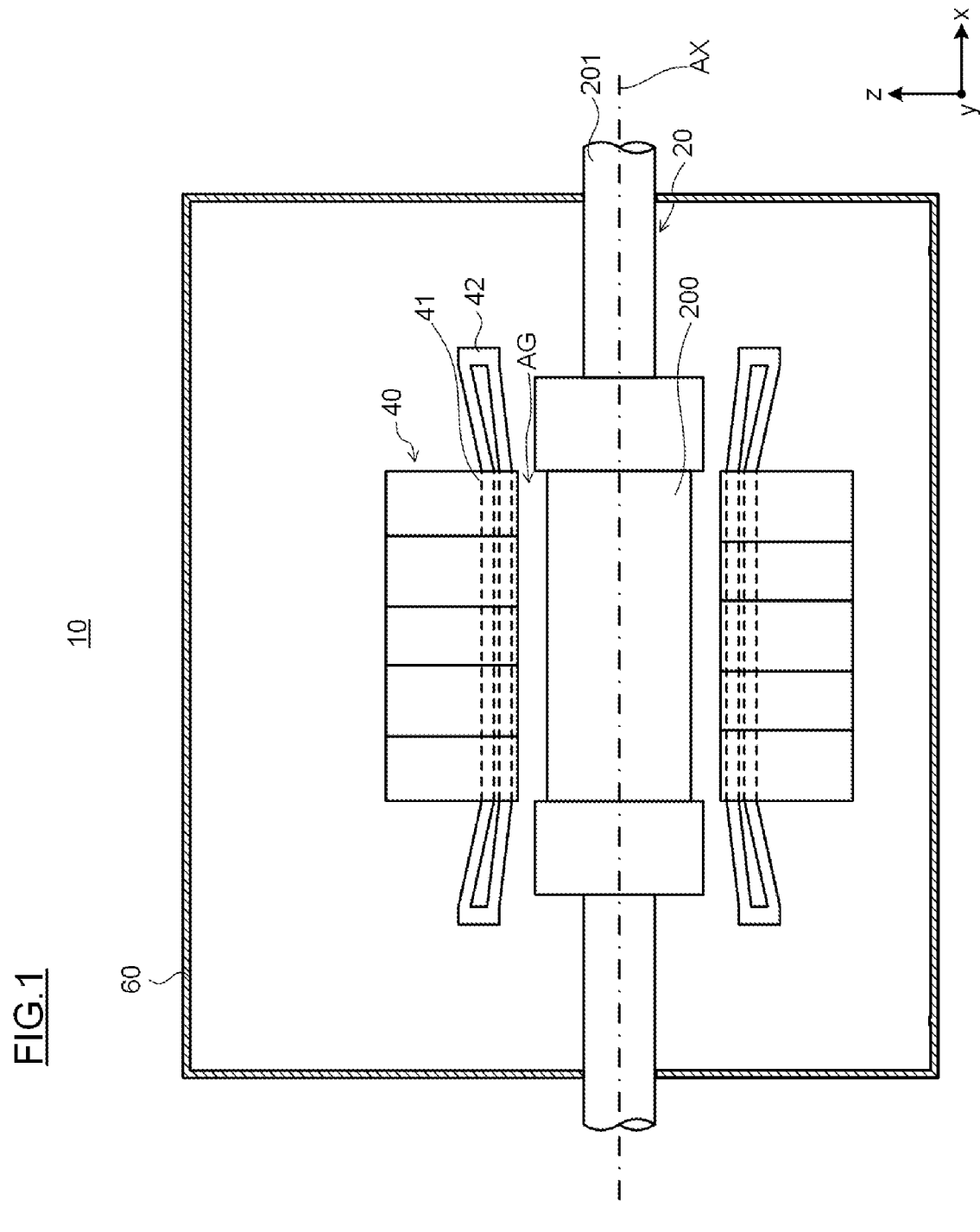
FIG. 1 is a view schematically illustrating an example of a rotary electric machine 10 being a managed object of a rotary electric machine managing system in a first embodiment.

FIG. 1 is a view schematically illustrating an example of the rotary electric machine 10 being the managed object of the rotary electric machine managing system in a first embodiment.

As illustrated in FIG. 1, in the rotary electric machine 10, a rotor 20 and a stator 40 are housed in a rotary electric machine casing 60. The rotary electric machine 10 is an inner rotor type generator, for example, and is configured in such a way as to perform power generation by the rotor 20 rotating inside the stator 40.

[A-1] Rotor 20

More specifically, the rotor 20 is disposed in such a way that its axial direction along a rotation axis AX runs along a horizontal direction x. Here, as for the rotor 20, a rotor core 200 having a cylindrical shape is disposed coaxial in relation to a rotary shaft 201. A rotor slot is formed in the rotor core 200, though not illustrated, and a rotor coil or the like is housed in the rotor slot.

[A-2] Stator 40

In the stator 40, a stator coil 42 is disposed in a stator core 41. The stator core 41 has a cylindrical shape and is disposed coaxial in relation to the rotary shaft 201. The stator core 41 is disposed in such a way as to surround the rotor core 200 via an air gap AG of a cylindrical shape.

Figure 2:
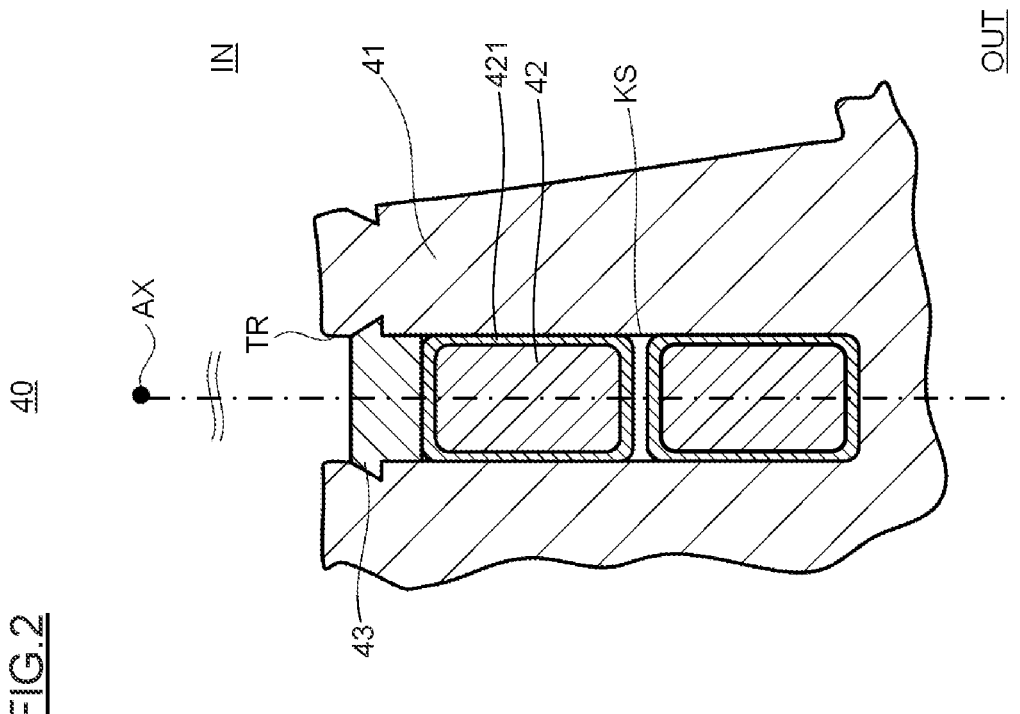
FIG. 2 is a cross-sectional view illustrating in enlargement a cross section of a stator 40 in the first embodiment.

FIG. 2 is a cross-sectional view illustrating in enlargement a cross section of the stator 40 in the first embodiment. In FIG. 2, a part of a surface orthogonal to the axial direction of the rotation axis AX is illustrated.

As for the stator 40, a stator slot KS is formed in the stator core 41. The stator slot KS is a groove which is depressed in a radial direction of the rotation axis AX and is formed in a part positioned on an inner peripheral side IN in the stator core 41. Here, the stator slot KS extends in the axial direction of the rotation axis AX. Though not illustrated, a plurality of the stator slots KS are provided in an array with an interval in a circumferential direction of the rotation axis AX.

As for the stator core 41, the stator coil 42 is housed in the stator slot KS. The stator coil 42 is constituted by integrating a plurality of wires (not illustrated), for example. In the stator slot KS, an insulating member 421 intervenes between the stator core 41 and the stator coil 42. The insulating member 421 is configured by winding an insulating tape such as a mica tape around the stator coil 42, for example.

Additionally, on the inner peripheral side IN of the stator coil 42, a stator wedge 43 is disposed, and the stator coil 42 is fixed to the stator slot KS by the stator wedge 43.

[B] Configuration of Rotary Electric Machine Managing System 700

A configuration of the rotary electric machine managing system 700 which is used for managing the aforementioned rotary electric machine 10 (see FIG. 1) will be described.

Figure 3:
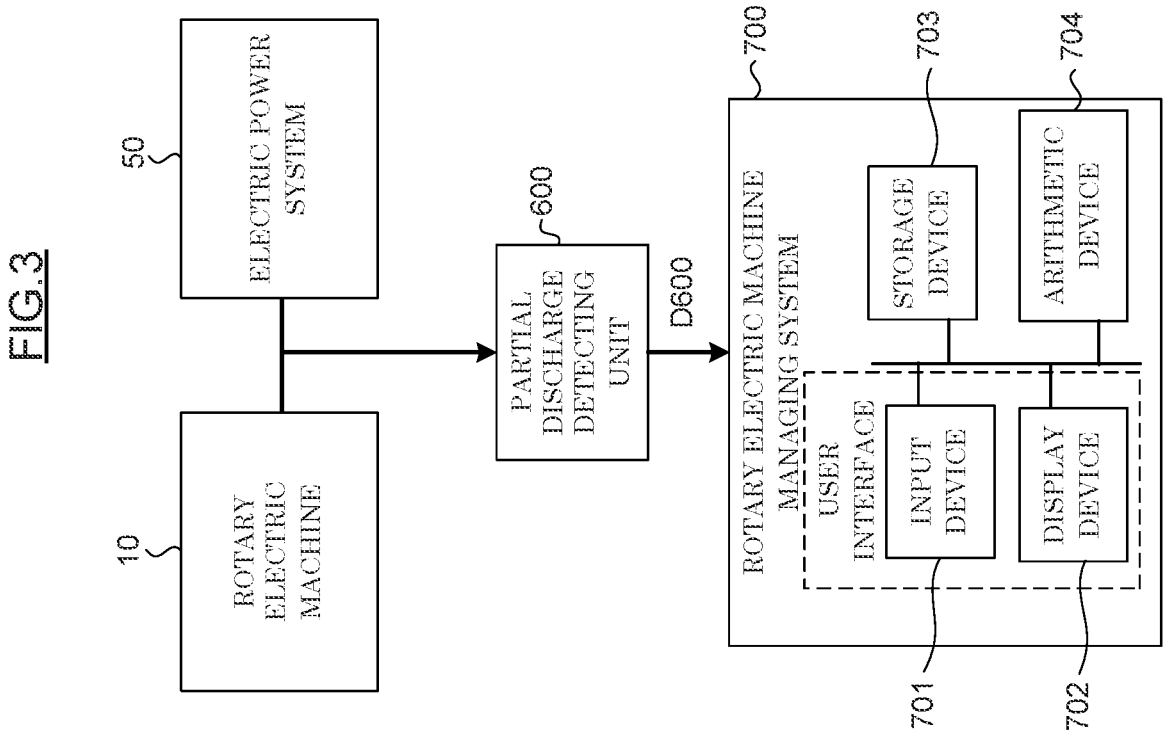
FIG. 3 is a block diagram schematically illustrating a configuration of a rotary electric machine managing system 700 according to the first embodiment.

FIG. 3 is a block diagram schematically illustrating the configuration of the rotary electric machine managing system 700 according to the first embodiment.

As illustrated in FIG. 3, the rotary electric machine managing system 700 of the embodiment is constituted by a computer, for example, and has an input device 701, a display device 702, a storage device 703, and an arithmetic device 704. The rotary electric machine managing system 700 is configured in such a way as to manage breakdown voltage-related information related to a breakdown voltage of the insulating member 421 (see FIG. 2) which constitutes the stator 40 of the rotary electric machine 10, details being described later.

[B-1] Input Device 701

The input device 701 includes an information input apparatus such as a keyboard and a pointing device (mouse, trackball, touch panel), for example, and is provided for a user to perform a manipulation of inputting various information. The input device 701 may further have a microphone or the like for implementing an audio input as an information input apparatus, other than the pointing device.

[B-2] Display Device 702

The display device 702 is an information output device which includes a display, for example, and is provided to display an image on a screen.

The display device 702 constitutes a user interface together with the input device 701, for example. Here, the user interface may be a graphical user interface where a touch panel is installed as the input device 701 in the screen of the display device 702, for example. Further, the rotary electric machine managing system 700 may further have a printer or the like for implementing a printing display output as an information output device as an apparatus constituting the user interface, other than the display device 702.

[B-3] Storage Device 703

The storage device 703 includes a hard disc drive and a memory, for example, and is provided to store various information. The storage device 703 may be a cloud storage which constitutes a cloud system.

The storage device 703 stores information having been input in the input device 701 and information related to an arithmetic result of the arithmetic device 704, details being described later. Further, the storage device 703 stores a partial discharge signal D600 which a partial discharge detecting unit 600 outputs. The partial discharge signal D600 is a signal detected by the partial discharge detecting unit 600 when power generated in the rotary electric machine 10 by the operation of the rotary electric machine 10 is output to an electric power system 50 (power transmission/transformation apparatus or the like), for example, and is output to the rotary electric machine managing system 700 in a state where conversion from an analog signal to a digital signal is performed, for example, and is stored in the storage device 703.

Note that the partial discharge signal D600 may be a signal obtained by converting a digital signal having been acquired in a voltage unit to a digital signal of an electric charge amount unit, based on a preliminarily obtained relationship between a digital signal of the voltage unit and a digital signal of the electric charge amount unit. Further, the partial discharge signal D600 may be a digital signal having been subjected to a denoising process.

[B-4] Arithmetic Device 704

The arithmetic device 704 includes a central processing unit (CPU), for example.

The arithmetic device 704 functions as an arithmetic unit which implements various arithmetic processing by using a program that the storage unit 703 stores, details being described later. The arithmetic device 704 may be an arithmetic apparatus which constitutes the cloud system.

[C] Function of Rotary Electric Machine Managing System 700

Figure 4:
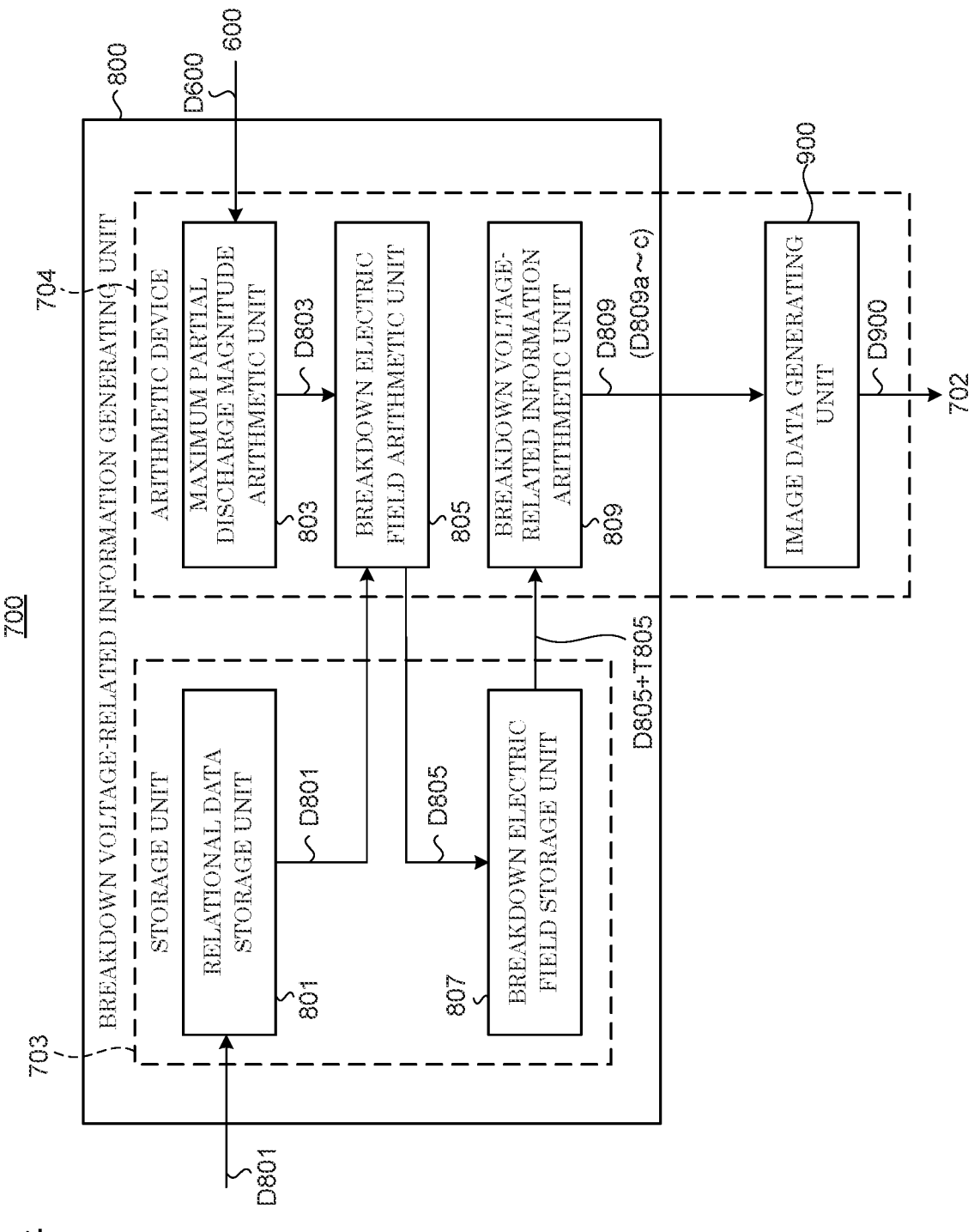
FIG. 4 is a functional block diagram illustrating a substantial part of a function of the rotary electric machine managing system 700 according to the first embodiment.

FIG. 4 is a functional block diagram illustrating a substantial part of a function of the rotary electric machine managing system 700 according to the first embodiment.

As illustrated in FIG. 4, the rotary electric machine managing system 700 has a breakdown voltage-related information generating unit 800 and an image data generating unit 900.

In the rotary electric machine managing system 700, the breakdown voltage-related information generating unit 800 includes a relational data storage unit 801, a maximum partial discharge magnitude arithmetic unit 803, a breakdown electric field arithmetic unit 805, a breakdown electric field storage unit 807, and a breakdown voltage-related information arithmetic unit 809 as illustrated in FIG. 4, and is configured in such a way as to find breakdown voltage-related information D809 by an arithmetic operation.

The image data generating unit 900 is configured in such a way as to generate image data D900 which indicates the breakdown voltage-related information D809 generated by the breakdown voltage-related information generating unit 800.

In the rotary electric machine managing system 700, it is configured in such a way that the storage device 703 functions as the related data storage unit 801 and the breakdown electric field storage unit 807, and that the arithmetic device 704 functions as the maximum partial discharge magnitude arithmetic unit 803, the breakdown electric field arithmetic unit 805, the breakdown voltage-related information arithmetic unit 809, and the image data generating unit 900.

Each unit which constitutes the rotary electric machine managing system 700 will be sequentially described.

[C-1] Relational Data Storage Unit 801

The relational data storage unit 801 stores, in advance, a relationship between a breakdown electric field (BDE) of the insulating member 421 which constitutes the stator 40 of the rotary electric machine 10 (see FIG. 2) and a maximum partial discharge magnitude (Qmax) measured in the rotary electric machine 10 as relational data D801.

[C-2] Maximum Partial Discharge Magnitude Arithmetic Unit 803

The maximum partial discharge magnitude arithmetic unit 803 finds the maximum partial discharge magnitude by analyzing the partial discharge signal D600 which is actually obtained from the rotary electric machine 10 at the time of operation of the rotary electric machine 10, and outputs the above as maximum partial discharge magnitude data D803.

[C-3] Breakdown Electric Field Arithmetic Unit 805

The breakdown electric field arithmetic unit 805 finds the breakdown electric field (BDE) corresponding to the maximum partial discharge magnitude data D803 which the maximum partial discharge magnitude arithmetic unit 803 outputs based on the relational data D801 which the relational data storage unit 801 stores, and outputs the above as breakdown electric field data D805.

[C-4] Breakdown Electric Field Storage Unit 807

The breakdown electric field storage unit 807 stores the breakdown electric field data D805 which the breakdown electric field arithmetic unit 805 outputs, in association with acquisition time point data T805 related to a time point when the partial discharge signal D600 is acquired.

[C-5] Breakdown Voltage-Related Information Arithmetic Unit 809

The breakdown voltage-related information arithmetic unit 809 finds the breakdown voltage-related information D809, based on the breakdown electric field data D805 stored in association with the acquisition time point data T805 in the breakdown electric field storage unit 807.

As the breakdown voltage-related information D809, there are found past breakdown voltage-related information D809a related to the breakdown voltage of the past, present breakdown voltage-related information D809b related to the breakdown voltage of the present, and future breakdown voltage-related information D809c related to the breakdown voltage of the future, by the breakdown voltage-related information arithmetic unit 809, details being described later.

[C-6] Image Data Generating Unit 900

The image data generating unit 900 is configured in such a way as to generate the image data D900 indicating the breakdown voltage-related information D809 generated by the breakdown voltage-related information arithmetic unit 809.

The image data generating unit 900 generates the image data D900 in such a way as to indicate the past breakdown voltage-related information D809a, the present breakdown voltage-related information D809b, and the future breakdown voltage-related information D809c as the breakdown voltage-related information D809, details being described later.

[D] Actions of Rotary Electric Machine Managing System 700

Figure 5A:
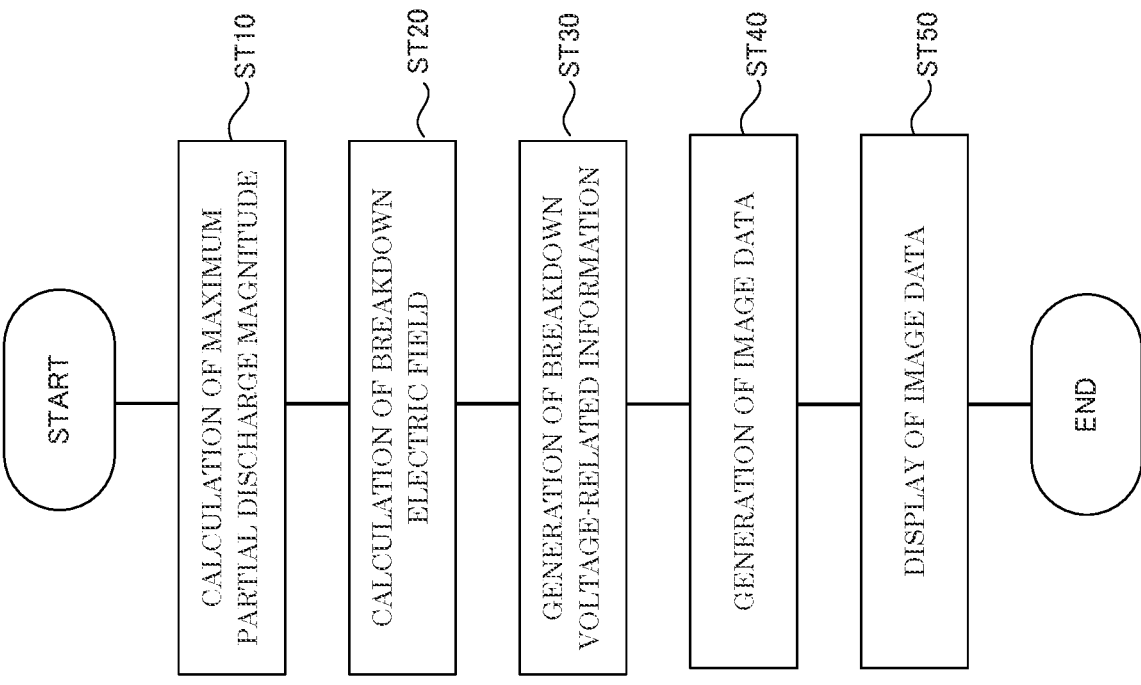
FIG. 5A is a flowchart illustrating actions of the rotary electric machine managing system 700 according to the first embodiment.

FIG. 5A is a flowchart illustrating actions of the rotary electric machine managing system 700 according to the first embodiment.

As illustrated in FIG. 5A, the rotary electric machine managing system 700 of this embodiment sequentially implements calculation of the maximum partial discharge magnitude (=maximum partial discharge magnitude data D803) (ST10), calculation of the breakdown electric field (=breakdown electric field data D805) (ST20), generation of the breakdown voltage-related information D809 (ST30), generation of the image data D900 (ST40), and display of the image data D900 (ST50). These actions are started in response to a command which is input in the input device 701, for example.

Each action of the rotary electric machine managing system 700 of this embodiment will be sequentially described with reference to FIG. 5A as well as FIG. 4 mentioned above.

[D-1] Calculation of Maximum Partial Discharge Magnitude (ST10)

First, as illustrated in FIG. 5A, the calculation of the maximum partial discharge magnitude (ST10) is implemented.

The calculation of the maximum partial discharge magnitude (ST10) is implemented by the maximum partial discharge magnitude arithmetic unit 803 (see FIG. 4). In the maximum partial discharge magnitude arithmetic unit 803, there is input the partial discharge signal D600 which is actually obtained from the rotary electric machine 10 at the time of operation of the rotary electric machine 10. Then, the maximum partial discharge magnitude arithmetic unit 803 analyzes the partial discharge signal D600, to thereby find the maximum partial discharge magnitude. The maximum partial discharge magnitude found by analysis in the maximum partial discharge magnitude arithmetic unit 803 is output from the maximum partial discharge magnitude arithmetic unit 803 as the maximum partial discharge magnitude data D803.

The maximum partial discharge magnitude is the largest electric charge magnitude of partial discharges occurring at times equal to or more than a predetermined number of times per second (at least one of 10 pps, 50 pps, and 60 pps), and is found based on "IEC60034-27-1 Annex B B.2).

[D-2] Calculation of Breakdown Electric Field (ST20)

Next, as illustrated in FIG. 5A, the calculation of the breakdown electric field (ST20) is implemented.

The calculation of the breakdown electric field (ST20) is implemented by the breakdown electric field arithmetic unit 805 (see FIG. 4). In the breakdown electric field arithmetic unit 805, the maximum partial discharge magnitude data D803 is input from the maximum partial discharge magnitude arithmetic unit 803 and the relational data D801 is input from the relational data storage unit 801.

Here, the relational data D801 is data obtained by implementing a prior laboratory test, for example. The prior laboratory test is implemented by supplying electric power from a power supply (not illustrated) to a test object (not illustrated) which simulates the rotary electric machine 10, for example. By implementing the prior laboratory test, a relationship between a breakdown electric field and a maximum partial discharge magnitude regarding the test object (not illustrated) is found. Then, that relationship between the breakdown electric field and the maximum partial discharge magnitude regarding the test object is stored in the relational data storage unit 801 as the aforementioned relational data D801. The relational data D801 is a function, a look-up table, or the like, for example. The relational data D801 may be data which can be obtained by implementing, other than the prior laboratory test, an actual machine test similar to the aforementioned prior laboratory test regarding an actual machine of the rotary electric machine 10.

Then, in the breakdown electric field arithmetic unit 805, there is found and output the breakdown electric field corresponding to the maximum partial discharge magnitude data D803 among the relational data D801 indicating the relationship between the breakdown electric field and the maximum partial discharge magnitude, as the breakdown electric field data D805. Note that the breakdown electric field corresponding to the maximum partial discharge magnitude data D803 is found by a prediction interval lower limit value of an approximated curve of the relational data D801. In finding a prediction interval, a specified significant level may be determined arbitrarily in consideration of a usage status, but it is desirable to use a value which can specify a range equivalent to an inverse number of a number of the stator coils used in the rotary electric machine.

The breakdown electric field data D805 which the breakdown electric field arithmetic unit 805 outputs is stored in the breakdown electric field storage unit 807 in association with the acquisition time point data T805 related to the time point when the partial discharge signal D600 is acquired.

[D-3] Generation of Breakdown Voltage-Related Information D809 (ST30)

Next, as illustrated in FIG. 5A, the generation of the breakdown voltage-related information D809 (ST30) is implemented.

The generation of the breakdown voltage-related information D809 (ST30) is implemented by the breakdown voltage-related information arithmetic unit 809 (see FIG. 4). In the breakdown voltage-related information arithmetic unit 809, the breakdown electric field data D805 which is stored in association with the acquisition time point data T805 is input from the breakdown electric field storage unit 807. Then, from the breakdown electric field data D805 which is stored in association with the acquisition time point data T805, the breakdown voltage-related information arithmetic unit 809 finds the breakdown voltage-related information D809.

In this embodiment, for example, as shown by (Formula 1) and (Formula 2) below, a breakdown voltage change rate BDVr [%] is found as the breakdown voltage-related information D809, based on the breakdown electric field BDE [V/m] which the breakdown electric field arithmetic unit 805 found. In other words, as shown in (Formula 1), by multiplying the breakdown electric field BDE [V/m] by a thickness TI (nominal insulation thickness) of the insulating member 421, the breakdown voltage BDV [V] is calculated. Then, as shown in (Formula 2), a percentage of the breakdown voltage value BDV [V] in relation to an initial voltage resistance value VR [V] of the insulating member 421 is calculated as the breakdown voltage change rate BDVr [%]. Note that the initial voltage resistance value VR [V] is a measured value, for example, but may be an estimated value estimated from a property of a material.

$$BDE * TI = BDV \qquad \text{(Formula 1)}$$

$$(BDV/VR) * 100 = BDVr \qquad \text{(Formula 2)}$$

In the breakdown voltage-related information arithmetic unit 809, there are generated the past breakdown voltage-related information D809a related to the breakdown voltage of the past, the present breakdown voltage-related information D809b related to the breakdown voltage of the present, and the future breakdown voltage-related information D809c related to the breakdown voltage of the future, as the breakdown voltage-related information D809.

The past breakdown voltage-related information D809a is found based on the partial discharge signal D600 obtained from the rotary electric machine 10 at the time of operation in the rotary electric machine 10 of the past. In other words, the past breakdown voltage-related information D809a is found by using the breakdown electric field data D805 obtained by the partial discharge signal D600 which is obtained from the rotary electric machine 10 in the past operation, among the breakdown electric field data D805 which is stored in association with the acquisition time point data T805 in the breakdown electric field storage unit 807.

The present breakdown voltage-related information D809b is found based on the partial discharge signal D600 obtained from the rotary electric machine 10 at the time of operation in the rotary electric machine 10 of the present. In other words, the present breakdown voltage-related information D809b is found by using the breakdown electric field data D805 obtained by the partial discharge signal D600 obtained from the rotary electric machine 10 in the present operation, among the breakdown electric field data D805 which is stored in association with the acquisition time point data T805 in the breakdown electric field storage unit 807.

The future breakdown voltage-related information D809c is found by implementing extrapolation based on the past breakdown voltage-related information D809a in this embodiment.

[D-4] Generation of Image Data D900 (ST40)

Next, as illustrated in FIG. 5A, the generation of the image data D900 (ST40) is implemented.

The generation of the image data D900 (ST40) is implemented by the image data generating unit 900 (see FIG. 4). In the image data generating unit 900, the breakdown voltage-related information D809 is input from the breakdown voltage-related information arithmetic unit 809. The breakdown voltage-related information D809 includes the past breakdown voltage-related information D809a, the present breakdown voltage-related information D809*b*, and the future breakdown voltage-related information D809*c*. The image data D900 indicating the breakdown voltage-related information D809 is generated by the image data generating unit 900.

Figure 5B:
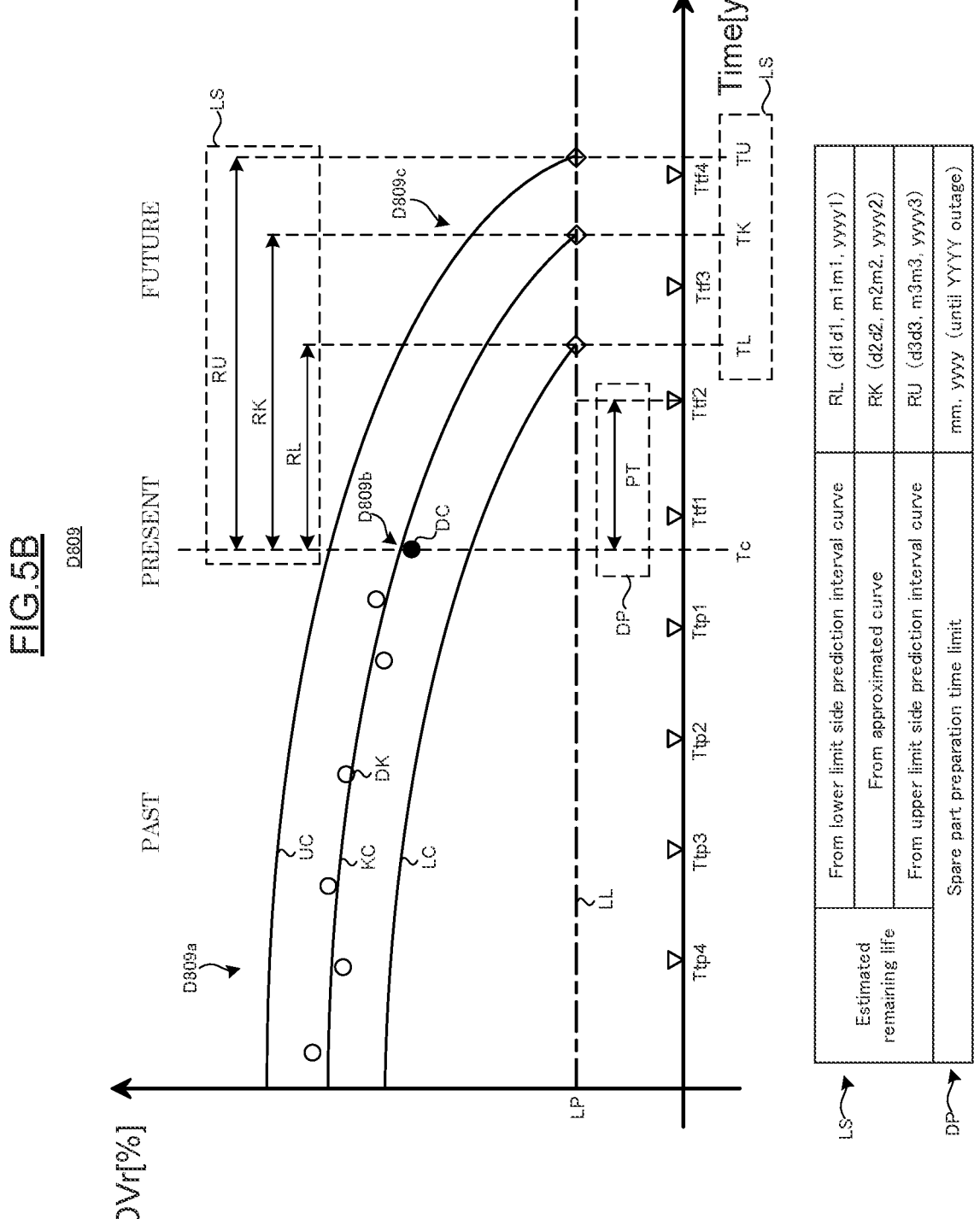
FIG. 5B is a view schematically illustrating an example of a content of image data D900 in the rotary electric machine managing system 700 according to the first embodiment.

FIG. 5B is a view schematically illustrating an example of a content of the image data D900 in the rotary electric machine managing system 700 according to the first embodiment.

As illustrated in FIG. 5B, the image data D900 is generated in such a way as to indicate the past breakdown voltage-related information D809*a*, the present breakdown voltage-related information D809*b*, and the future breakdown voltage-related information D809*c* along a time axis of usage of the rotary electric machine 10.

More specifically, the image data D900 includes a graph in which a horizontal axis indicates a time (Time [y]) (time when the partial discharge detecting unit 600 receives an analog signal) and a vertical axis indicates a breakdown voltage change rate BDVr [%] (percentage of breakdown voltage value BDV in relation to initial voltage resistance value VR).

In the graph of the image data D900, a plurality of white circular markers DK are plotted as the past breakdown voltage-related information D809*a* and a black circular marker DC is plotted as the present breakdown voltage-related information D809*b*. The plural white circular markers DK indicate values of the breakdown voltage change rates BDVr [%] in the past (before Tc) at intervals of a predetermined time. The black circular marker DC indicates a value of the breakdown voltage change rate BDVr [%] at the present moment Tc.

In the graph of the image data D900, in order to indicate a trend, each of an approximated curve KC (regression curve), an upper limit side prediction interval curve UC, and a lower limit side prediction interval curve LC is indicated by a solid line as the past breakdown voltage-related information D809*a* and the future breakdown voltage-related information D809*c*. The approximated curve KC is created by approximating a value of the breakdown voltage change rate BDVr [%] of the past. The upper limit side prediction interval curve UC is created in such a way as to indicate an upper limit side of the prediction interval of the approximated curve KC. The lower limit side prediction interval curve LC is created in such a way as to indicate a lower limit side of the prediction interval of the approximated curve KC. A part of the past (before Tc) of the approximated curve KC, the upper limit side prediction interval curve UC, and the lower limit side prediction interval curve LC, is the past breakdown voltage-related information D809*a*, and a part of the future (after Tc) is the future breakdown voltage-related information D809*c*.

Each of the approximated curve KC, the upper limit side prediction interval curve UC, and the lower limit side prediction interval curve LC which are indicated as the future breakdown voltage-related information D809*c* is equivalent to a line obtained by implementing extrapolation on each of the approximated curve KC, the upper limit side prediction interval curve UC, and the lower limit side prediction interval curve LC which are indicated as the past breakdown voltage-related information D809*a*.

The aforementioned approximation is implemented by linear approximation of a least squares method or the like, for example. The approximation may be implemented by nonlinear approximation, other than the linear approximation. In the nonlinear approximation, calculation of a plurality of undetermined coefficients is possible by using a Gauss-Newton method. Further, a significant level used for determining the prediction interval may be arbitrarily decided by a user.

In the graph of the image data D900, breakdown voltage lower limit value information LL related to a lower limit value LP of the breakdown voltage change rate BDVr [%] is indicated by a dot and dash line. The lower limit value LP of the breakdown voltage change rate BDVr [%] is a value determined as a standard or a value which the user inputs by using the input device 701 in consideration of a stable operation, for example.

In the graph of the image data D900, there is indicated remaining life-related information LS related to a time when the breakdown voltage change rate BDVr [%] is estimated to reach the lower limit value LP from the present, as the future breakdown voltage-related information D809*c*. The remaining life-related information LS is generated by finding a time point when each of the approximated curve KC, the upper limit side prediction interval curve UC, and the lower limit side prediction interval curve LC intersects with the lower limit value LP of the breakdown voltage change rate BDVr [%]. Here, the remaining life-related information LS includes a remaining life period RK found from the approximated curve KC, a remaining life period RU found from the upper limit side prediction interval curve UC, and a remaining life period RL found from the lower limit side prediction interval curve LC. Other than the above, the remaining life-related information LS includes a remaining life estimated reach time point TK found from the approximated curve KC, a remaining life estimated reach time point TU found from the upper limit side prediction interval curve UC, and a remaining life estimated reach time point TL found from the lower limit side prediction interval curve LC.

In the horizontal axis of the graph of the image data D900, a plurality of inverted triangle-shaped markers are plotted in such a way as to indicate regular inspection time points Ttp1 to Ttp4, Ttf1 to Ttf4 when regular inspections are implemented on the rotary electric machine 10.

Additionally, in the graph of the image data D900, preparation time limit information DP for preparing a spare part used for updating the rotary electric machine 10 is indicated as the future breakdown voltage-related information D809*c*. The preparation time limit information DP is a time point before the remaining life estimated reach time point TL when the breakdown voltage change rate BDVr [%] is estimated to reach the lower limit value LP from the present, and is generated by finding the regular inspection time point Ttf2 that is the nearest to the remaining life estimated reach time point TL among the plural regular inspection time points Ttp1 to Ttp4, Ttf1 to Ttf4 as the preparation time limit, for example. Here, the preparation time limit information DP includes information of a preparation period PT from the present time point Tc to the regular inspection time point Ttf2 being the preparation time limit, other than the information of the regular inspection time point Ttf2 being the preparation time limit.

The image data D900, which further includes a table other than the graph as illustrated in FIG. 5B, is generated in such a way as to indicate the aforementioned remaining life-related information LS and the aforementioned preparation time limit information DP by the table.

[D-5] Display of Image Data D900 (ST50)

Next, as illustrated in FIG. 5A, the display of the image data D900 (ST50) is implemented.

The display of the image data D900 (ST50) is implemented by the display device 702 (see FIG. 4). In the display device 702, the image data D900 is input from the image data generating unit 900. The display device 702 displays the image data D900 on the screen as described above (see FIG. 5B).

Each step described above is implemented at a predetermined time interval, for example, and the image data D900 is updated serially. The present breakdown voltage-related information D809*b* is used as the past breakdown voltage-related information D809*a* after a predetermined time passes from the present, for example.

[F] Summary

As described above, in the rotary electric machine managing system 700 of this embodiment, the image data generating unit 900 generates the image data D900 indicating the past breakdown voltage-related information D809*a* related to the breakdown voltage of the past, the present breakdown voltage-related information D809*b* related to the breakdown voltage of the present, and the future breakdown voltage-related information D809*c* related to the breakdown voltage of the future. The past breakdown voltage-related information D809*a* is information found based on the partial discharge signal D600 obtained from the rotary electric machine 10 at the time of operation in the rotary electric machine 10 of the past. The present breakdown voltage-related information D809*b* is information found based on the partial discharge signal D600 obtained from the rotary electric machine 10 at the time of operation in the rotary electric machine 10 of the present. The future breakdown voltage-related information D809*c* is information obtained by implementing extrapolation based on the past breakdown voltage-related information D809*a*. Here, the image data generating unit 900 generates the image data D900 in such a way that the past breakdown voltage-related information D809*a*, the present breakdown voltage-related information D809*b*, and the future breakdown voltage-related information D809*c* are indicated along the time axis of usage of the rotary electric machine 10. Therefore, according to this embodiment, it is easy to realize accurate grasping of aging of the information related to the breakdown voltage even without stopping the operation of the rotary electric machine 10.

In this embodiment, the image data D900 includes the approximated curve KC, the upper limit side prediction interval cure UC, and the lower limit side prediction interval curve LC. Therefore, in this embodiment, it is possible to accurately grasp the aging of the information related to the breakdown voltage in consideration of variation of information related to the breakdown voltage.

In this embodiment, the image data D900 includes the breakdown voltage lower limit value information LL related to the lower limit value LP which is set for the property related to the breakdown voltage. Further, the image data D900 includes the remaining life-related information LS related to the time when the property related to the breakdown voltage is estimated to reach the aforementioned lower limit value LP from the present. Therefore, according to this embodiment, it is possible to accurately mange a remaining life of the rotary electric machine 10.

In this embodiment, the image data generating unit 900 generates the image data D900 in such a way that the time point before the remaining life estimated reach time point when the property related to the breakdown voltage is estimated to reach the lower limit value LP from the present is indicated as the preparation time limit information DP for preparing the spare part used for updating the rotary electric machine 10. Therefore, according to this embodiment, it is possible to properly implement the preparation of the spare part used for updating the rotary electric machine 10.

The rotary electric machine managing system 700 of this embodiment has the breakdown voltage-related information generating unit 800. In the breakdown voltage-related information generating unit 800, based on the relational data D801 which the relational data storage unit 801 stores, the breakdown electric field arithmetic unit 805 finds the breakdown electric field corresponding to the maximum partial discharge magnitude data D803 which the maximum partial discharge magnitude arithmetic unit 803 outputs, and outputs the breakdown electric field as the breakdown electric field data D805. Then, based on the breakdown electric field data D805 which is stored in association with the acquisition time point data T805, the breakdown voltage-related information arithmetic unit 809 finds the past breakdown voltage-related information D809*a* and the present breakdown voltage-related information D809*b*. Thus, according to this embodiment, it is possible to easily obtain the breakdown voltage-related information.

[G] Modified Example

A modified example of the aforementioned embodiment will be described.

Figure 6:
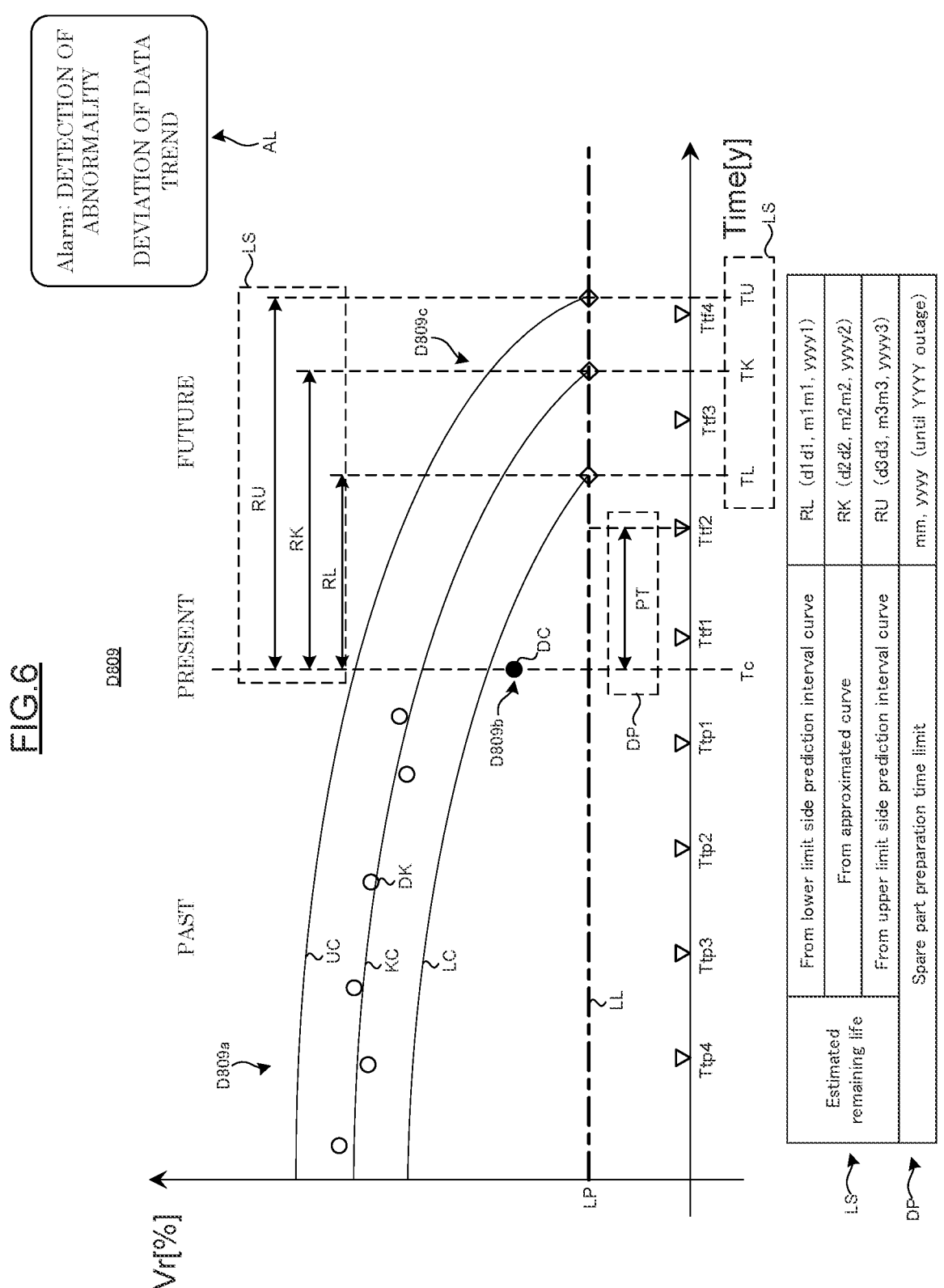
FIG. 6 is a view schematically illustrating an example of a content of image data D900 in a rotary electric machine managing system 700 according to a modified example of the first embodiment.

FIG. 6 is a view schematically illustrating an example of a content of image data D900 in a rotary electric machine managing system 700 according to a modified example of the first embodiment.

As illustrated in FIG. 6, this modified example shows a case where, in the image data D900, a breakdown voltage change rate BDVr [%] (black circular marker DC) of the present which is included as present breakdown voltage-related information D809*b* is a value smaller than that of a lower limit side prediction interval curve LC and is out of a prediction interval, unsimilarly to the case of the aforementioned embodiment (see FIG. 5B).

In this case, in this modified example, an image data generating unit 900 generates the image data D900 in such a way that alarm information AL which warns that the breakdown voltage change rate BDVr [%] of the present (black circular marker DC) is out of a prediction interval, and a display device 702 displays that image data D900. Therefore, in this modified example, it is possible to easily grasp an occurrence of abnormality in the breakdown voltage change rate BDVr [%] of a rotary electric machine 10.

Second Embodiment

[A] Function of Rotary Electric Machine Managing System 700

Figure 7:
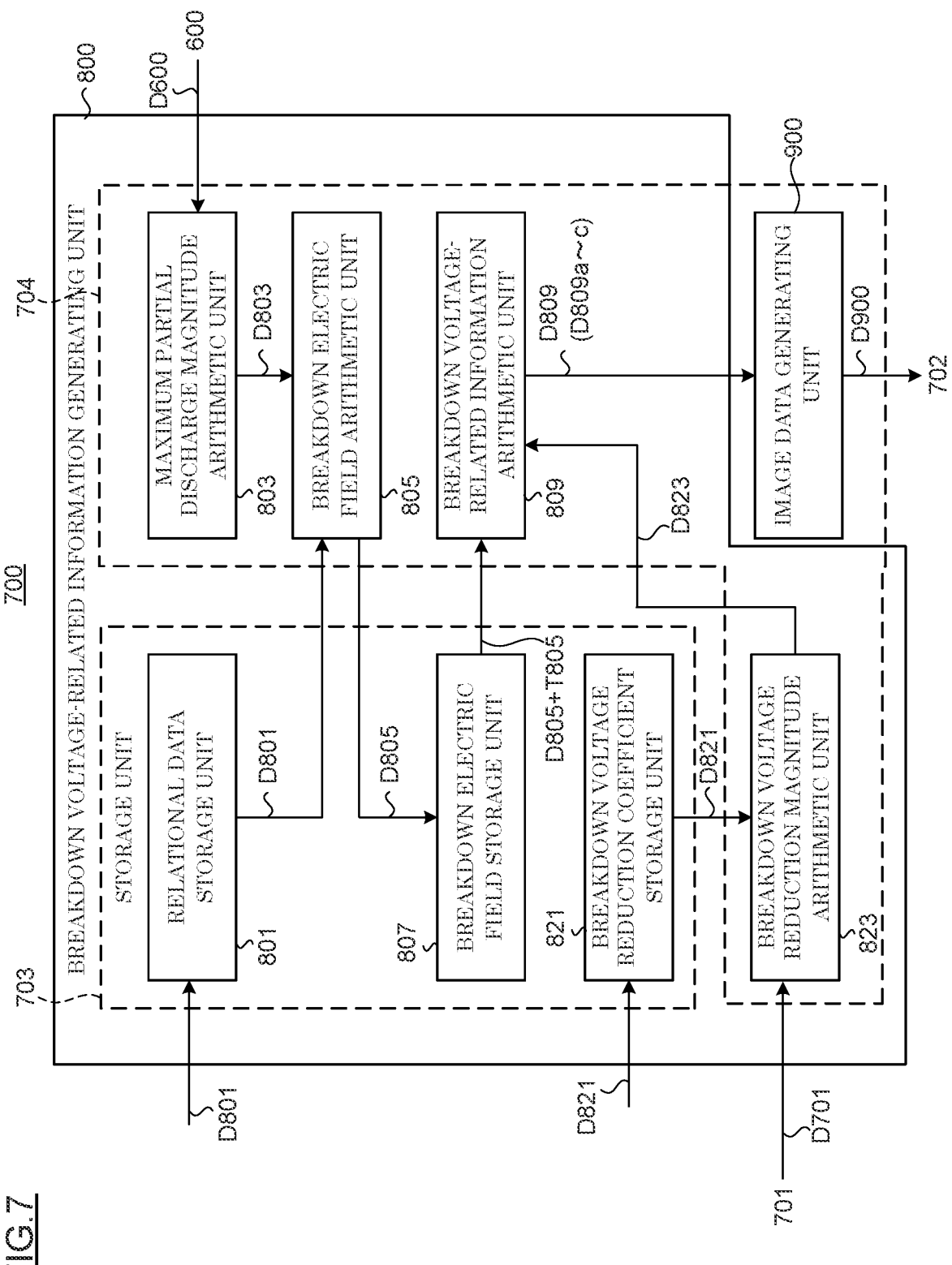
FIG. 7 is a functional block diagram illustrating a substantial part of a function of a rotary electric machine managing system 700 according to a second embodiment.

FIG. 7 is a functional block diagram illustrating a substantial part of a function of a rotary electric machine managing system 700 according to a second embodiment.

As illustrated in FIG. 7, the rotary electric machine managing system 700 in this embodiment is different from the case of the first embodiment (see FIG. 4) in terms of a part of a configuration of a breakdown voltage-related information generating unit 800. Except for the above and a point related thereto, this embodiment is the same as the first embodiment. Therefore, in explaining this embodiment, for items whose explanation overlaps that of the aforementioned embodiment, an explanation will be properly omitted.

The breakdown voltage-related information generating unit 800 of this embodiment has, similarly to the case of the first embodiment (see FIG. 4), a relational data storage unit 801, a maximum partial discharge magnitude arithmetic unit 803, a breakdown electric field arithmetic unit 805, a breakdown electric field storage unit 807, a breakdown voltage-related information arithmetic unit 809, and an image data generating unit 900, as illustrated in FIG. 7.

Other than the above, the breakdown voltage-related information generating unit 800 of this embodiment further has a breakdown voltage reduction coefficient storage unit 821 and a breakdown voltage reduction magnitude arithmetic unit 823, as illustrated in FIG. 7, unsimilarly to the case of the first embodiment (see FIG. 4). The rotary electric machine managing system 700 is configured in such a way that a storage device 703 functions as the breakdown voltage reduction coefficient storage unit 821, and that an arithmetic device 704 functions as the breakdown voltage reduction magnitude arithmetic unit 823.

[A-1] Breakdown Voltage Reduction Coefficient Storage Unit 821

The breakdown voltage reduction coefficient storage unit 821 stores a reduction voltage reduction coefficient which indicates a percentage of reduction of a breakdown voltage in response to operating condition information in relation to an operating condition of a rotary electric machine 10, as breakdown voltage reduction coefficient data D821.

The breakdown voltage reduction coefficient data D821 is data which is obtained by implementing a prior laboratory test, for example, similarly to the relational data D801. The breakdown voltage reduction coefficient data D821 may be data which is obtained by implementing an actual machine test, other than the primary laboratory test. The breakdown voltage reduction coefficient data D821 is a look-up table, for example, and the breakdown voltage reduction coefficient data D821 is stored in association with the operating condition information.

[A-2] Breakdown Voltage Reduction Magnitude Arithmetic Unit 823

The breakdown voltage reduction magnitude arithmetic unit 823 outputs the breakdown voltage reduction magnitude as breakdown voltage reduction magnitude data D823, the breakdown voltage reduction magnitude being a magnitude of reduction of the breakdown voltage by operation plan information D701 related to an operation plan under which an operation is performed in the rotary electric machine 10 of the future, based on the breakdown voltage reduction coefficient data D821 which the breakdown voltage reduction coefficient storage unit 821 stores.

The operation plan information D701 is information which is input by a manipulation by using a user interface screen, and is information which a user inputs in an input device 701 (see FIG. 3) while referring to an input manipulation screen displayed on a screen of a display device 702 (see FIG. 3), details being described later.

[A-3] Breakdown Voltage-Related Information Arithmetic Unit 809

In this embodiment, the breakdown voltage-related information arithmetic unit 809 finds future breakdown voltage-related information D809c based on the breakdown voltage reduction magnitude data D823 which the breakdown voltage reduction magnitude arithmetic unit 823 outputs, unsimilarly to the case of the first embodiment. In other words, in this embodiment, the future breakdown voltage-related information D809c is found based on the operation plan information D701.

[B] Actions of Rotary Electric Machine Managing System 700

Figure 8A:
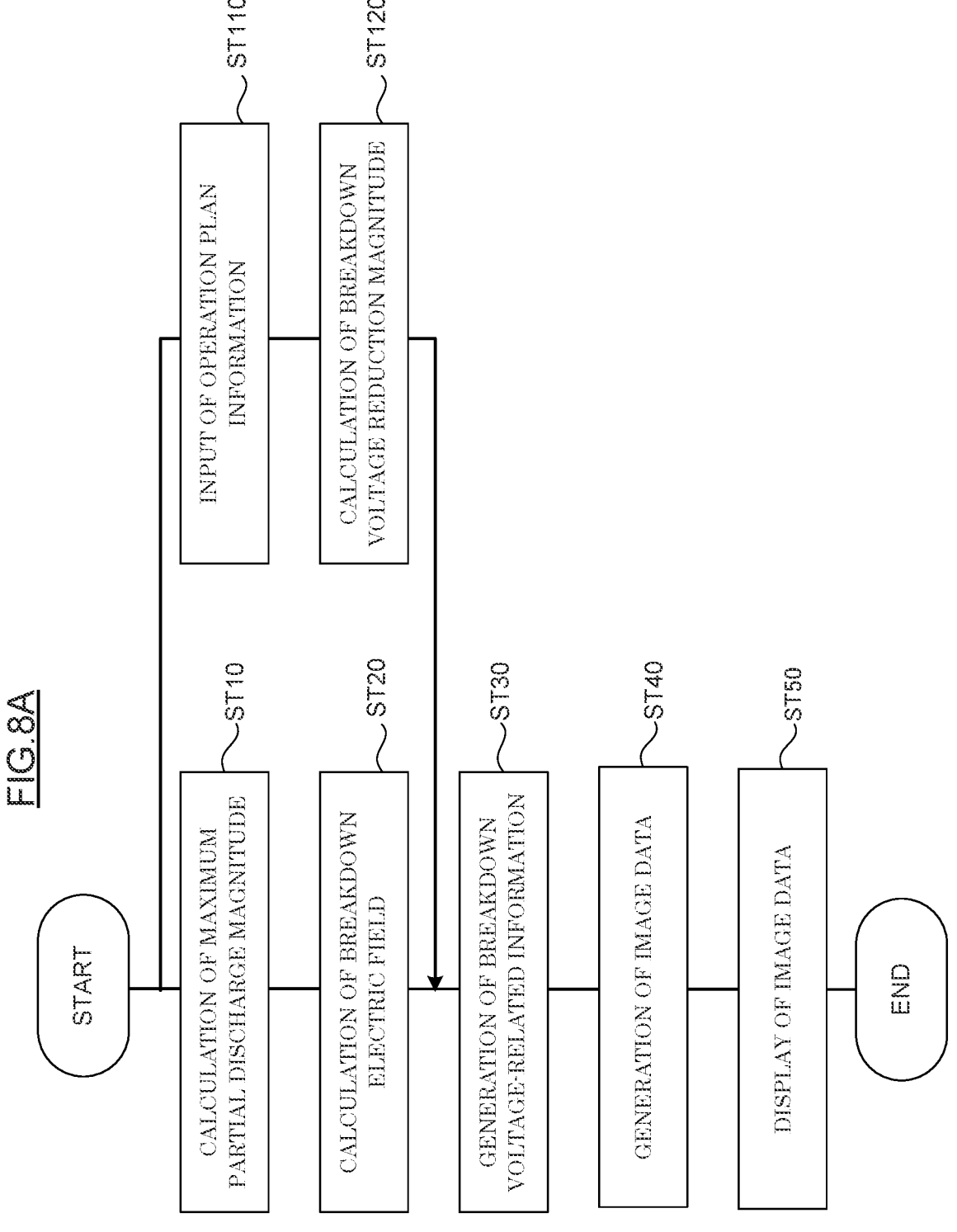
FIG. 8A is a flowchart illustrating actions of the rotary electric machine managing system 700 according to the second embodiment.

FIG. 8A is a flowchart illustrating actions of the rotary electric machine managing system 700 according to the second embodiment.

Each action of the rotary electric machine managing system 700 of this embodiment will be sequentially described with reference to FIG. 8A and aforementioned FIG. 7.

[B-1] Calculation of Maximum Partial Discharge Magnitude (ST10), Calculation of Breakdown Electric Field (ST20)

First, as illustrated in FIG. 8A, calculation of a maximum partial discharge magnitude (ST10) and calculation of a breakdown electric field (ST20) are implemented, similarly to the case of the first embodiment (see FIG. 5A).

[B-2] Input of Operation Plan Information D701 (ST110)

Together with the above, in this embodiment, an input of the operation plan information D701 (ST110) is implemented as illustrated in FIG. 8A.

The input of the operation plan information D701 (ST110) is implemented by a user's manipulating the input device 701 while referring to the input manipulation screen displayed on the screen of the display device 702 (see FIG. 3).

FIG. 8B is a view schematically illustrating an example of an input manipulation image which is used when the input of operation plan information D701 (ST110) is implemented in the rotary electric machine managing system 700 according to the second embodiment.

As illustrated in FIG. 8B, the input manipulation image includes a section of "Annual operational information", a section of "Annual percentage of load fluctuation pattern", and a section of "Data update".

The section of "Annual operational information" is a section indicating information related to an operation performed in the rotary electric machine 10 of the future. In the section of "Annual operational information", there are indicated "Annual operating rate", "Annual operating hours", "Number of start/stop", "Cumulative operation time", and "Cumulative start/stop count", for example. The "Annual operating rate" is a percentage of implementation of the operation of the rotary electric machine 10 per year [%/year]. The "Annual operating hours" is hours of implementation of the operation of the rotary electric machine 10 per year [hour/year]. The "Number of start/stop" is a number of implementations of starts and stops in the operation of the rotary electric machine 10 per year [N/year]. The "Cumulative operation time" is a cumulative value of hours of implementation of the operation of the rotary electric machine 10 [hour]. The "Cumulative start/stop count" is a cumulative value of the number of implementations of starts and stops in the operation of the rotary electric machine 10 [N].

The section of "Annual percentage of load fluctuation pattern" is a section which indicates information related to a percentage of a load fluctuation pattern of the operation which is implemented in the rotary electric machine 10 of the future. The load fluctuation pattern is a pattern of transition of an electric power value which the rotary electric machine 10 outputs at the time of operation, in relation to a rated output value being a value of an electric power which the rotary electric machine 10 outputs in a rated operation during one day (from 0:00 to 24:00), for example. In the section of the "Annual percentage of load fluctuation pattern", there is indicated each percentage of implementation of six load fluctuation patterns (Pattern 1 to 6) in a time span of a year, for example. Further, in the section of "Annual percentage of load fluctuation pattern", "Annual operating rate" is further indicated.

The section of "Data update" is a section indicating information related to a file for updating the load fluctuation pattern. In this embodiment, it is illustrated by an example that the load fluctuation patterns 1 to 3 are load fluctuation patterns having been stored in advance while the load fluctuation patterns 4 to 6 are patterns which the user creates.

In the input manipulation image, an item underlined in FIG. 8B is an example of the item which is input by the user as the operation plan information D701. Here, "Number of start/stop" in the section of "Annual operational information" is input by the user. Further, in the section of "Annual percentage of load fluctuation pattern", a percentage of implementation of the operation of six patterns (patterns 1 to 6) is input by the user. In updating the load fluctuation pattern, the file related to the load fluctuation pattern to be updated is uploaded to the input device 701 by the user, as indicated in the section of "Data update".

In the input manipulation image, information of an item which is not underlined in FIG. 8B is automatically found and displayed in response to the information which is input as the operation plan information D701. For example, the "Annual operating rate" is equivalent to a value obtained by adding up the percentage of each pattern in the section of "Annual percentage of load fluctuation pattern". Further, the "Annual operating hours" are equivalent to hours converted from the "Annual operating rate". The "Cumulative operation time" is equivalent to a value obtained by sequentially adding up the "Annual operating hours" in each year. The "Cumulative start/stop count" is equivalent to a value obtained by sequentially adding up the "Number of start/stop" in each year.

The input of the operation plan information D701 (ST110) is implemented by pressing an "Edit" button in the input manipulation image, for example. Further, the input of the operation plan information D701 is canceled by pressing a "Cancel" button in the input manipulation image, for example. Further, the operation plan information D701 having been input is saved by pressing a "Save" button in the input manipulation image, for example, and the operation plan information D701 is output from the input device 701 to the breakdown voltage reduction magnitude arithmetic unit 823.

[B-3] Calculation of Breakdown Voltage Reduction Magnitude (ST120)

Next, in this embodiment, calculation of the breakdown voltage reduction magnitude (ST120) is implemented, as illustrated in FIG. 8A.

The calculation of the breakdown voltage reduction magnitude (ST120) is implemented by the breakdown voltage reduction magnitude arithmetic unit 823 (see FIG. 7). In the breakdown voltage reduction magnitude arithmetic unit 823, the operation plan information D701 is input from the input device 701, as described above. Other than the above, in the breakdown voltage reduction magnitude arithmetic unit 823, the breakdown voltage reduction coefficient data D821 is input from the breakdown voltage reduction coefficient storage unit 821.

The breakdown voltage reduction coefficient data D821 is data related to the breakdown voltage reduction coefficient which indicates a percentage of reduction of the breakdown voltage in response to the operating condition information included in the operation plan information D701. The breakdown voltage reduction coefficient data D821 includes the breakdown voltage reduction coefficient which indicates a percentage of reduction of the breakdown voltage in response to the "Annual operating hours" included in the operation plan information D701, for example. Further, the breakdown voltage reduction coefficient data D821 includes the breakdown voltage reduction coefficient which indicates a percentage of reduction of the breakdown voltage in response to "Equivalent number of start/stop" which is found from the "Annual percentage of load fluctuation pattern" included in the operation plan information D701, for example.

The "Equivalent number of start/stop" is found by converting fluctuation of an output of the rotary electric machine 10 by the load fluctuation pattern to a value equivalent to the number of start/stop. Here, the "Equivalent number of start/stop ES" is calculated according to (Formula A) below which is indicated by a load MW (power output), a time t, and a rated load MWr (rated power output).

$$ES = \frac{\int_{t0}^{t} \left| \frac{dMW}{dt} \right| dt}{2MWr} \qquad \text{(Formula A)}$$

Then, the breakdown voltage reduction magnitude arithmetic unit 823 calculates the breakdown voltage reduction magnitude by using the operation plan information D701 and the breakdown voltage reduction coefficient data D821. Here, the "Breakdown voltage reduction magnitude $D_i$" of a year i is calculated by using a breakdown voltage reduction coefficient $C_j$ of a factor j which is included in the breakdown voltage reduction coefficient data D821 and a value $F_{ij}$ of the factor j for the year i which is included in the operation plan information D701, according to (Formula B) below.

$$D_i = \sum_{j=0} C_j F_{ij} \qquad \text{(Formula B)}$$

The "Breakdown voltage reduction magnitude $D_i$" of the year i is calculated according to (Formula C) below, in a case where the factor j is an operating hour T, an equivalent number of start/stop N, and a percentage of load fluctuation pattern R, and where the breakdown voltage reduction coefficient $C_j$ is a breakdown voltage reduction coefficient $C_0$ of the operating hour T, a breakdown voltage reduction coefficient $C_1$ of the equivalent number of start/stop N, and a breakdown voltage reduction coefficient $C_2$ of the percentage of the load fluctuation pattern R, for example.

$$D_i = C_0 T_i + C_1 N_i + C_2 R_i \qquad \text{(Formula C)}$$

Then, the breakdown voltage reduction magnitude arithmetic unit 823 outputs the calculated breakdown voltage reduction magnitude as the breakdown voltage reduction magnitude data D823.

[B-4] Generation of Breakdown Voltage-Related Information D809 (ST30)

Next, as illustrated in FIG. 8A, generation of the breakdown voltage-related information D809 (ST30) is implemented.

The generation of the breakdown voltage-related information D809 (ST30) is implemented by the breakdown voltage-related information arithmetic unit 809 (see FIG. 7). In the breakdown voltage-related information arithmetic unit 809, the breakdown electric field data D805 which is stored in association with the acquisition time point data T805 is input from the breakdown electric field storage unit 807, similarly to the case of the first embodiment (see FIG. 4). Further, from the breakdown electric field data D805 which is stored in association with the acquisition time point data T805, the breakdown voltage-related information arithmetic unit 809 finds the past breakdown voltage-related information D809a and the present breakdown voltage-related information D809b as the breakdown voltage-related information D809.

Other than the above, in this embodiment, in the breakdown voltage-related information arithmetic unit 809, the breakdown voltage reduction magnitude data D823 is input from the breakdown voltage reduction magnitude arithmetic unit 823, unsimilarly to the case of the first embodiment (see FIG. 4). The breakdown voltage-related information arithmetic unit 809 finds the future breakdown voltage-related information D809$c$ based on the breakdown voltage reduction magnitude data D823 which the breakdown voltage reduction magnitude arithmetic unit 823 outputs. In other words, in this embodiment, the future breakdown voltage-related information D809$c$ is not found by extrapolation but is found by using the breakdown voltage reduction magnitude data D823 which is found in response to the operation plan information D701. For example, as the future breakdown voltage-related information D809$c$, a breakdown voltage change rate BDVr [%] is found per year of the future.

[B-5] Generation of Image Data D900 (ST40)

Next, as illustrated in FIG. 8A, generation of the image data D900 (ST40) is implemented.

The generation of the image data D900 (ST40) is implemented by the image data generating unit 900 (see FIG. 7).

Figure 8C:
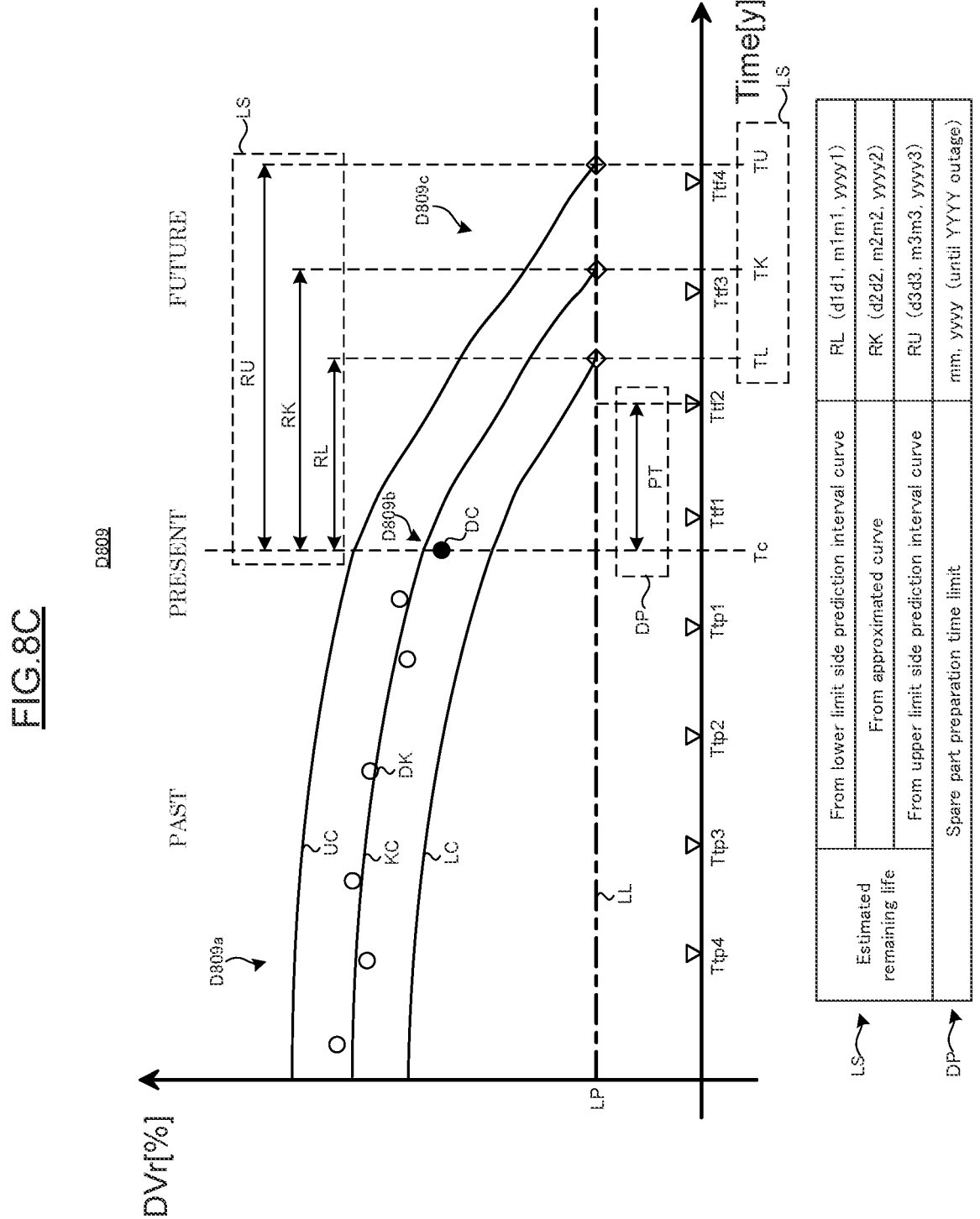
FIG. 8C is a view schematically illustrating an example of a content of image data D900 in the rotary electric machine managing system 700 according to the second embodiment.

FIG. 8C is a view schematically illustrating an example of a content of the image data D900 in the rotary electric machine managing system 700 according to the second embodiment.

As illustrated in FIG. 8C, as for the image data D900 of this embodiment, parts indicating the past breakdown voltage-related information D809$a$ and the present breakdown voltage-related information D809$b$ are generated, similarly to the case of the first embodiment (see FIG. 5B). In contrast, a part indicating the future breakdown voltage-related information D809$c$ in the image data D900 of this embodiment is different from the case of the first embodiment (see FIG. 5B).

In a graph of the image data D900 of this embodiment, as the future breakdown voltage-related information D809$c$, each of an approximated curve KC, an upper limit side prediction interval curve UC, and a lower limit side prediction interval curve LC is generated in such a way as to be indicated by a solid line.

More specifically, the approximated curve KC indicated as the future breakdown voltage-related information D809$c$ is not generated by extrapolation of the past breakdown voltage-related information D809$a$ but is generated in such a way as to indicate transition of reduction of the breakdown voltage change rate BDVr [%] from the approximated curve KC of the past breakdown voltage-related information D809$a$ in response to the operation plan information D701 of each year, by a solid line.

Each of the upper limit side prediction interval curve UC and the lower limit side prediction interval curve LC which are indicated as the future breakdown voltage-related information D809$c$ is also generated similarly in such a way as to indicate transition of reduction of the breakdown voltage change rate BDVr [%] from each of the upper limit side prediction interval curve UC and the lower limit side prediction interval curve LC of the past breakdown voltage-related information D809$a$ in response to the operation plan information D701 of each year, by a solid line.

[B-6] Display of Image Data D900 (ST50)

Next, as illustrated in FIG. 8A, display of the image data D900 (ST500) is implemented.

The display of the image data D900 (ST50) is implemented by the display device 702 (see FIG. 7), similarly to the case of the first embodiment.

Note that the rotary electric machine managing system 700 acts as above so as to update the image data D900 which indicates the future breakdown voltage-related information D809$c$ every time the operation plan information D701 is updated.

[C] Summary

As described above, in the rotary electric machine managing system 700 of this embodiment, the future breakdown voltage-related information D809$c$ is information which is found based on the operation plan information D701 related to the operation plan under which the operation is performed in the rotary electric machine 10 of the future. Therefore, in this embodiment, it is possible to accurately grasp aging of information related to the breakdown voltage in response to the operation plan under which the operation is performed in the rotary electric machine 10 of the future. Consequently, in this embodiment, it is possible to examine the operation of the rotary electric machine efficiently.

In the breakdown voltage-related information arithmetic unit 809 of this embodiment, the breakdown voltage reduction coefficient storage unit 821 stores the breakdown voltage reduction coefficient which indicates the percentage of the reduction of the breakdown voltage in response to the operating condition information related to the operating condition of the rotary electric machine 10 as the breakdown voltage reduction coefficient data D821. The breakdown voltage reduction magnitude arithmetic unit 823 outputs the breakdown voltage reduction magnitude which is a magnitude of reduction of the breakdown voltage by the operation plan information D701 based on the breakdown voltage reduction coefficient data D821, as the breakdown voltage reduction magnitude data D823. Then, the breakdown voltage-related information arithmetic unit 809 finds the future breakdown voltage-related information D809$c$ based on the breakdown voltage reduction magnitude data D823. Therefore, according to this embodiment, it is possible to easily obtain the future breakdown voltage-related information D809$c$ corresponding to the operation plan information D701.

[G] Modified Example

A modified example of the aforementioned embodiment will be described.

Figure 9:
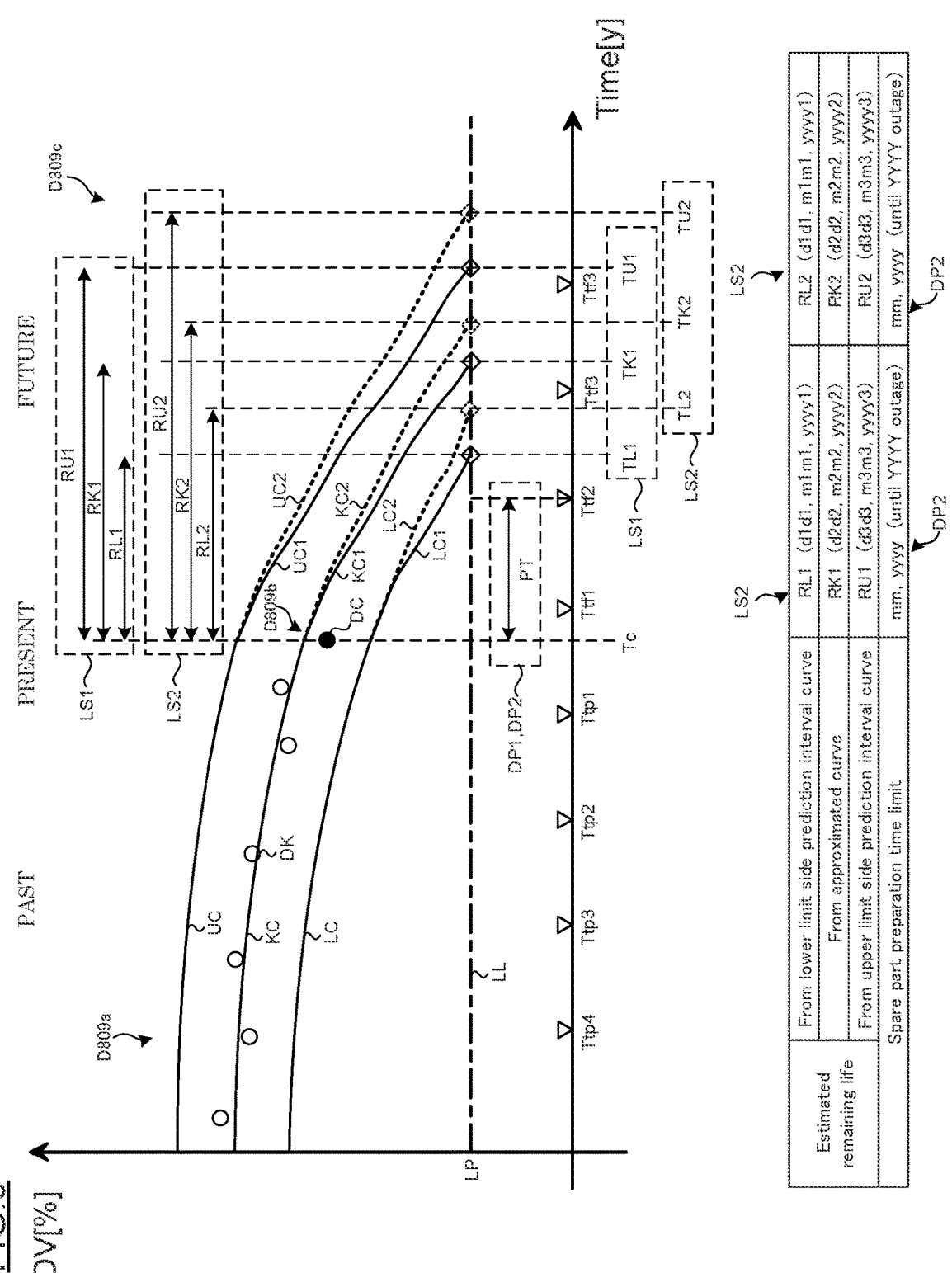
FIG. 9 is a view schematically illustrating an example of a content of image data D900 in a rotary electric machine managing system 700 according to a modified example of the second embodiment.

FIG. 9 is a view schematically illustrating an example of a content of image data D900 in a rotary electric machine managing system 700 according to a modified example of the second embodiment.

In this modified example, as illustrated in FIG. 9, in a graph of image data D900, each of an approximated curve KC1, an upper limit side prediction interval curve UC1, and a lower limit side prediction interval curve LC1 is indicated by a solid line as future breakdown voltage-related information D809$c$, and each of an approximated curve KC2, an upper limit side prediction interval curve UC2, and a lower limit side prediction interval curve LC2 is indicated by a dot and dash line.

Each of the approximated curve KC1, the upper limit side prediction interval curve UC1, and the lower limit side prediction interval curve LC1 indicates transition of reduction of a breakdown voltage change rate BDVr [%] which is calculated in response to first operation plan information that is input as operation plan information D701.

Each of the approximated curve KC2, the upper limit side prediction interval curve UC2, and the lower limit side prediction interval curve LC2 indicates transition of reduction of a breakdown voltage change rate BDVr [%] which is calculated in response to second operation plan information that is input as the operation plan information D701. Here, the first operation plan information and the second operation plan information are different from each other in terms of operating condition.

Further, in the graph of the image data D900, as illustrated in FIG. 9, remaining life-related information LS1 and remaining life information LS2 are indicated as future breakdown voltage-related information D809c.

The remaining life-related information LS1 is information related to a time when the breakdown voltage change rate BDVr [%] which is calculated in response to the first operation plan information having been input as the operation plan information D701 is estimated to reach a lower limit value LP from the present, and is generated by finding a time point when each of the approximated curve KC1, the upper limit side prediction interval curve UC1, and the lower limit side prediction interval curve LC1 intersects with a lower limit value LP of the breakdown voltage change rate BDVr [%]. Here, the remaining life-related information LS1 includes a remaining life period RK1 found from the approximated curve KC1, a remaining life period RU1 found from the upper limit side prediction interval curve UC1, and a remaining life period RL1 found from the lower limit side prediction interval curve LC1. Other than the above, the remaining life-related information LS1 includes a remaining life estimated reach time point TK1 found from the approximated curve KC1, a remaining life estimated reach time point TU1 found from the upper limit side prediction interval curve UC1, and a remaining life estimated reach time point TL1 found from the lower limit side prediction interval curve LC1.

In contrast, the remaining life-related information LS2 is information related to a time when the breakdown voltage change rate BDVr [%] which is calculated in response to the second operation plan information that is different from the first operation plan information is estimated to reach the lower limit value LP from the present, and is generated by finding a time point when each of the approximated curve KC2, the upper limit side prediction interval curve UC2, and the lower limit side prediction interval curve LC2 intersects with the lower limit value LP of the breakdown voltage change rate BDVr [%]. Here, the remaining life-related information LS2 includes a remaining life period RK2 found from the approximated curve KC2, a remaining life period RU2 found from the upper limit side prediction interval curve UC2, and a remaining life period RL2 found from the lower limit side prediction interval curve LC2. Other than the above, the remaining life-related information LS2 includes a remaining life estimated reach time point TK2 found from the approximated curve KC2, a remaining life estimated reach time point TU2 found from the upper limit side prediction interval curve UC2, and a remaining life estimated reach time point TL2 found from the lower limit side prediction interval curve LC2.

Other than the above, in the graph of the image data D900, preparation time limit information DP1 and preparation time limit information DP2 are indicated as future breakdown voltage-related information D809c, as illustrated in FIG. 9. The preparation time limit information DP1 is generated by finding a time point before the remaining life estimated reach time point TL1, that is, for example, a regular inspection time point Ttf2 which is the nearest to the remaining life estimated reach time point TL1 as a preparation time limit. The preparation time limit information DP2 is generated by finding a time point before the remaining life estimated reach time point TL2, that is, for example, a regular inspection time point Ttf2 which is the nearest to the remaining life estimated reach time point TL2 as a preparation time limit, for example. Here, the preparation time limit information DP1 and the preparation time limit information DP2 include information of the preparation period PT from the present time point Tc to the regular inspection time point Ttf2 being the preparation time limit, other than the information of the regular inspection time point Ttf2 being the preparation time limit.

The image data D900, which further includes a table other than the graph, is generated in such a way as to indicate the remaining life-related information LS1, the remaining life-related information LS2, the preparation time limit information DP1, and the preparation time limit information DP2 by the table, as illustrated in FIG. 9.

As described above, in this modified example, the image data generating unit 900 generates the image data D900 in such a way as to indicate first future breakdown voltage-related information (approximated curve KC1, upper limit side prediction interval curve UC1, lower limit side prediction interval curve LC1, remaining life-related information LS1, preparation time limit information DP1) which is found as the future breakdown voltage-related information D809c when the first operation plan information is input as the operation plan information D701. Additionally, the image data generating unit 900 generates the image data D900 in such a way as to indicate second future breakdown voltage-related information (approximated curve KC2, upper limit side prediction interval curve UC2, lower limit side prediction interval curve LC2, remaining life-related information LS2, preparation time limit information DP2) which is found as the future breakdown voltage-related information D809c when the second operation plan information D701 that is different from the first operation plan information D701 is input as the operation plan information D701. Here, the image data D900 is generated in such a way as to appose the first future breakdown voltage-related information and the second future breakdown voltage-related information as the future breakdown voltage-related information D809c.

Therefore, in this modified example, since the plural future breakdown voltage-related information D809c are indicated in response to the plural operation plan information D701, it is possible to accurately grasp how the future breakdown voltage-related information D809c changes by a content of the operation plan information D701.

Note that these actions are started in response to a command which is input in an input device 701, for example. Further, it may be configured to allow selection from a state of indicating the first future breakdown voltage-related information (approximated curve KC1, upper limit side prediction interval curve UC1, lower limit side prediction interval curve LC1, remaining life-related information LS1, preparation time limit information DP1) as well as the second future breakdown voltage-related information (approximated curve KC2, upper limit side prediction interval curve UC2, lower limit side prediction interval curve LC2, remaining life-related information LS2, preparation time limit information DP2), for example, and a state of indicating either one of the above, as the future breakdown voltage-related information, in response to a command which is input in the input device 701, for example.

Additionally, also in this embodiment, the image data D900 may be generated in such a way as to indicate alarm information AL (see FIG. 6), similarly to the modified example of the first embodiment.

OTHERS

While certain embodiments of the present invention have been described here, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A rotary electric machine managing system which manages breakdown voltage-related information related to a breakdown voltage of an insulating member, for a rotary electric machine that has a rotor and a stator in which a stator coil is housed in a stator slot formed in a stator core via the insulating member, the rotary electric machine managing system including: a processor and a storage, wherein the processor is configured in such a way as to generate image data which indicates past breakdown voltage-related information related to the breakdown voltage of the past, present breakdown voltage-related information related to the breakdown voltage of the present, and future breakdown voltage-related information related to the breakdown voltage of the future as the breakdown voltage-related information, wherein a property related to the breakdown voltage of the past is found based on a partial discharge signal obtained from the rotary electric machine of the past at a time of operation, and the past breakdown voltage-related information is a past approximated curve found from the property related to the breakdown voltage of the past;

the present breakdown voltage-related information is information found based on a partial discharge signal obtained from the rotary electric machine of the present at a time of operation;

the future breakdown voltage-related information is information found based on operation plan information related to an operation plan under which an operation is performed in the rotary electric machine of the future, and is information indicating a decreasing transition from the past approximated curve;

the operation plan information is information related to a power value output by the rotary electric machine; and the processor is configured to update the image data indicating the future breakdown voltage-related information every time the operation plan information is updated.

2. The rotary electric machine managing system according to claim 1, wherein the processor is configured to generate the image data in such a way as to indicate the past breakdown voltage-related information, the present breakdown voltage-related information, and the future breakdown voltage-related information along a time axis of usage of the rotary electric machine.

3. The rotary electric machine managing system according to claim 1, wherein the operation plan information is information which is input by a manipulation using a user interface screen.

4. The rotary electric machine managing system according to claim 1, wherein the processor is configured to generate the image data in such a way as to appose first future breakdown voltage-related information found as the future breakdown voltage-related information when first operation plan information is input as the operation plan information and second future breakdown voltage-related information found as the future breakdown voltage-related information when second operation plan information that is different from the first operation plan information is input as the operation plan information.

5. The rotary electric machine managing system according to claim 1, wherein the processor is configured to generate the image data in such a way as to indicate the past breakdown voltage-related information every predetermined time interval.

6. The rotary electric machine managing system according to claim 1, wherein the image data is generated in such a way as to indicate breakdown voltage lower limit value information related to a lower limit value which is set for a property related to the breakdown voltage.

7. The rotary electric machine managing system according to claim 6, wherein the image data is generated in such a way as to indicate remaining life-related information related to a time when the property related to the breakdown voltage is estimated to reach the lower limit value from the present.

8. The rotary electric machine managing system according to claim 7, wherein the processor is configured to generate the image data in such a way as to indicate a time point before a remaining life estimated reach time point when the property related to the breakdown voltage is estimated to reach the lower limit value from the present as preparation period information for preparing a spare part used for updating the rotary electric machine.

9. The rotary electric machine managing system according to claim 1, wherein the image data is generated in such a way as to indicate the past approximated curve found from the property related to the breakdown voltage of the past, an upper limit side prediction interval curve indicating an upper limit side of a prediction interval of the approximated curve, and a lower limit side prediction interval curve indicating a lower limit side of the prediction interval of the approximated curve.

10. The rotary electric machine managing system according to claim 9, wherein the processor is configured to generate the image data in such a way as to indicate alarm information warning that a property related to the breakdown voltage of the present which is included in the present breakdown voltage-related information is out of the prediction interval.

11. The rotary electric machine managing system according to claim 1, wherein the processor is configured in such a way as to find the past breakdown voltage-related information, the present breakdown voltage information, and the future breakdown voltage information by an arithmetic operation, the storage stores a relationship between a breakdown electric field of the insulating member and a maximum partial discharge magnitude measured in the rotary electric machine as relational data in advance, the processor is configured to find the maximum partial discharge magnitude by analyzing a partial discharge signal actually obtained from the rotary electric machine at a time of operation of the rotary electric machine, and outputs the maximum partial discharge magnitude as maximum partial discharge magnitude data, the processor is configured to find the breakdown electric field corresponding to the maximum partial discharge magnitude data that the processor outputs based on the relational data that the storage stores, and outputs the breakdown electric field as breakdown electric field data, the storage stores the breakdown electric field data that the processor outputs, in association with acquisition time point data related to a time point when the partial discharge signal is acquired, and the processor is configured to find the past breakdown voltage-related information and the present breakdown voltage-related information based on the breakdown electric field data stored in association with the acquisition time point data in the storage.

12. The rotary electric machine managing system according to claim 11, wherein the storage stores a breakdown voltage reduction coefficient indicating a percentage of reduction of the breakdown voltage in response to operating condition information related to an operating condition of the rotary electric machine as breakdown voltage reduction coefficient data; and the processor is configured to output a breakdown voltage reduction magnitude of reduction of the breakdown voltage by operation plan information related to an operation plan under which an operation is performed in the rotary electric machine of the future, based on the breakdown voltage reduction coefficient data that the storage stores as breakdown voltage reduction magnitude data; and wherein the processor is configured to find the future breakdown voltage-related information based on the breakdown voltage reduction magnitude data that the processor outputs.

* * * * *